(12) United States Patent
Rokuhara et al.

(10) Patent No.: US 10,634,862 B2
(45) Date of Patent: Apr. 28, 2020

(54) OPTICAL COMMUNICATION DEVICE, RECEPTION APPARATUS, TRANSMISSION APPARATUS, AND TRANSMISSION AND RECEPTION SYSTEM

(71) Applicant: Sony Corporation, Tokyo (JP)

(72) Inventors: Shinji Rokuhara, Kanagawa (JP); Shusaku Yanagawa, Kanagawa (JP); Eiji Otani, Kanagawa (JP); Shuichi Oka, Kanagawa (JP); Kazunao Oniki, Tokyo (JP); Hiizu Ootorii, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/199,908

(22) Filed: Nov. 26, 2018

(65) Prior Publication Data

US 2019/0094477 A1 Mar. 28, 2019

Related U.S. Application Data

(63) Continuation of application No. 15/477,527, filed on Apr. 3, 2017, now Pat. No. 10,168,498, which is a
(Continued)

(30) Foreign Application Priority Data

Nov. 22, 2013 (JP) .................................. 2013-242133

(51) Int. Cl.
*H01L 31/0232* (2014.01)
*H01L 31/0203* (2014.01)
(Continued)

(52) U.S. Cl.
CPC ......... *G02B 6/4257* (2013.01); *G02B 6/4204* (2013.01); *G02B 6/4206* (2013.01);
(Continued)

(58) Field of Classification Search
CPC .......... H01L 31/0232; H01L 27/14643; H01L 27/1463; H01L 31/0203; G02B 6/4206; G02B 6/4204
(Continued)

(56) References Cited

U.S. PATENT DOCUMENTS 5,864,416 A * 1/1999 Williams ................ H03F 3/082
398/202
7,437,030 B2 10/2008 Asai
(Continued)

FOREIGN PATENT DOCUMENTS

JP 2005-181610 7/2005
JP 2007-025310 A 2/2007

*Primary Examiner* — Thinh T Nguyen
(74) *Attorney, Agent, or Firm* — Michael Best & Friedrich LLP

(57) ABSTRACT

An optical communication device, reception apparatus, transmission apparatus and transmission and reception system are disclosed. The optical communication device includes a drive circuit substrate. A first through via extends through the drive circuit substrate and is configured to electrically connect an optical element disposed on a first surface side of the drive circuit substrate to a drive circuit disposed on a second surface side of the drive circuit substrate. A positioning element is attached to an interposer substrate and is configured to align optical axes of a first lens that is attached to a lens substrate and that faces a second lens that is disposed on the first surface side of the drive circuit substrate. A second through via extends through the interposer substrate and electrically connects the drive circuit to a signal processing circuit disposed on a signal processing substrate positioned above the interposer substrate.

15 Claims, 18 Drawing Sheets

Related U.S. Application Data continuation of application No. 14/539,260, filed on Nov. 12, 2014, now Pat. No. 9,614,347.

(51) Int. Cl.
*G02B 6/42* (2006.01)
*H01S 5/00* (2006.01)
*G02B 6/43* (2006.01)
*H04Q 11/00* (2006.01)

(52) U.S. Cl.
CPC ........... *G02B 6/428* (2013.01); *G02B 6/4244* (2013.01); *G02B 6/4245* (2013.01); *G02B 6/43* (2013.01); *H01L 31/0232* (2013.01); *H01S 5/005* (2013.01); *H01L 31/0203* (2013.01); *H01L 2224/05599* (2013.01); *H01L 2924/00014* (2013.01); *H04Q 2011/0041* (2013.01)

(58) Field of Classification Search
USPC ............... 257/431, 432, 434; 438/48, 54, 65
See application file for complete search history.

(56) References Cited

U.S. PATENT DOCUMENTS

| | | |
|---|---|---|
| 8,437,584 B2 | 5/2013 | Matsuoka |
| 2004/0190274 A1* | 9/2004 | Saito et al. ............ H05K 1/141 361/783 |
| 2006/0016962 A1 | 1/2006 | Ohtorii |
| 2006/0263003 A1 | 11/2006 | Asai |
| 2008/0308311 A1 | 12/2008 | Kodama |
| 2011/0026878 A1 | 2/2011 | Matsuoka |
| 2011/0042795 A1 | 2/2011 | Knickerbocker |
| 2011/0044367 A1 | 2/2011 | Budd |
| 2011/0058348 A1 | 3/2011 | Sakai |
| 2014/0294342 A1 | 10/2014 | Offrein |

\* cited by examiner

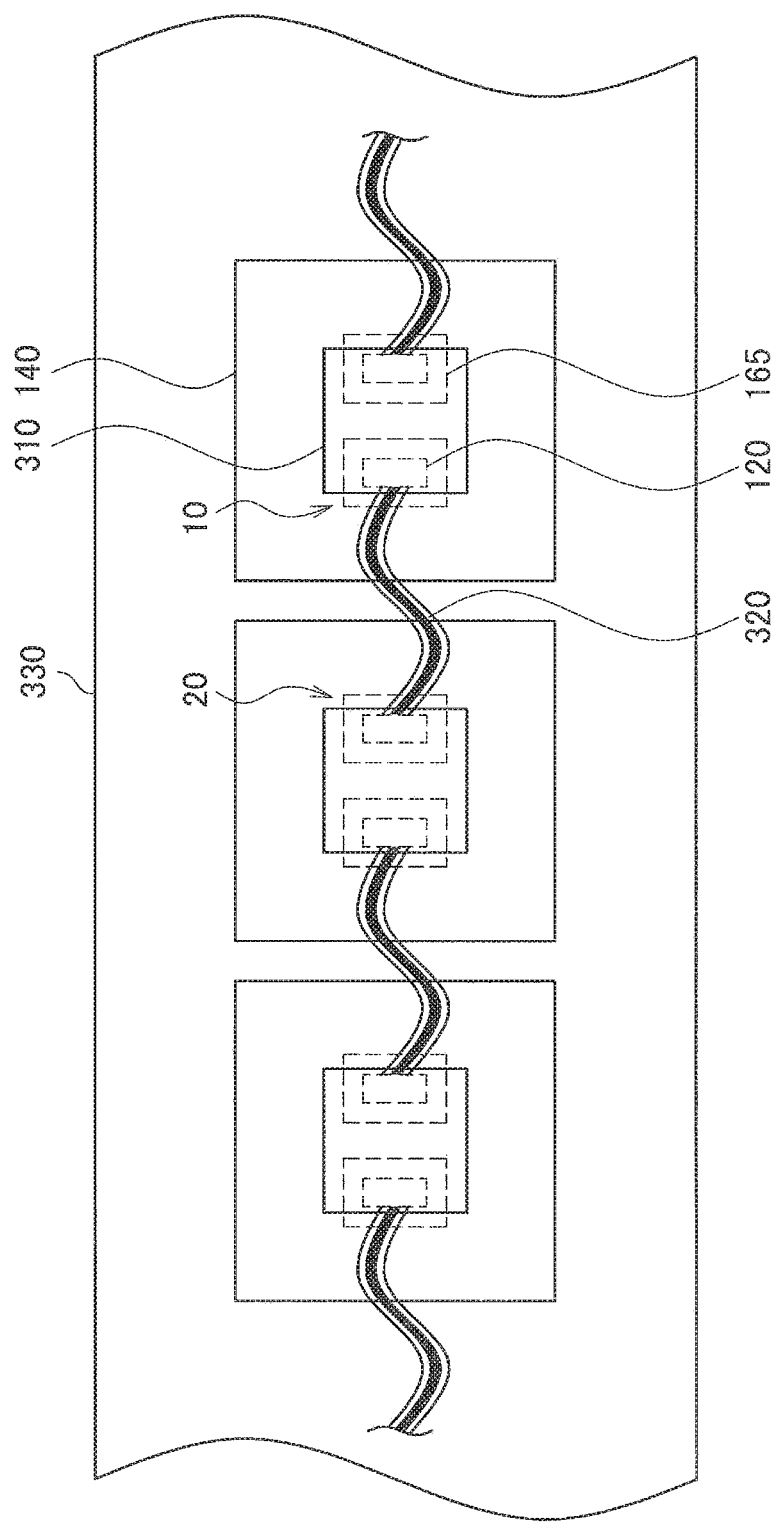

OPTICAL COMMUNICATION DEVICE, RECEPTION APPARATUS, TRANSMISSION APPARATUS, AND TRANSMISSION AND RECEPTION SYSTEM

CROSS REFERENCE TO RELATED APPLICATIONS

The present application is a Continuation of application Ser. No. 15/477,527, Apr. 3, 2017, which is a Continuation of application Ser. No. 14/539,260, filed Nov. 12, 2014, now U.S. Pat. No. 9,614,347, issuing on Apr. 4, 2017, and claims the benefit of Japanese Priority Patent Application JP 2013-242133 filed Nov. 22, 2013, the entire contents of which are incorporated herein by reference.

BACKGROUND

The present disclosure relates to an optical communication device, a reception apparatus, a transmission apparatus, and a transmission and reception system.

With the recent development of information-oriented society, an information processing apparatus such as personal computers (PCs) and servers handles an explosively increasing amount of information (the amount of data or signal). With such an increase in the amount of data, there is a growing necessity to transmit and receive more data between apparatus, devices, and chips at higher speed.

As an example, in a processor such as central processing units (CPUs) used in computers, the increase in its speed and functionality is progressing. In related art, the transmission and reception of data between processors are mainly carried out, for example, by using electrical signals through copper wiring on a substrate.

However, the high-speed data transmission carried out by using such data transmission technology employing electrical signals (electrical communication or interconnect technology) causes problems of RC signal delay, impedance mismatching, EMC/EMI, and crosstalk, which makes it difficult to further increase data transmission speed.

Thus, the optical communication technology that modulates electrical signals into optical data and transmits data using light (or optical interconnect technology) has been developed as data transmission technology that can be substituted for the electrical communication technology. For example, JP 2005-181610A discloses a socket for optical communication that includes an installation part for installing an optical waveguide, a light emitting element for making light incident to the optical waveguide, and a light receiving element for receiving light emitted from the optical waveguide. In this socket, at least one of the light emitting element and the light receiving element is arranged corresponding to the optical waveguide. In addition, JP 2007-25310A discloses a technique that makes a socket for optical communication thinner by defining a recess in the socket and fitting an interposer substrate into the recess.

SUMMARY

Even when the data transmission is carried out using light as described above, it is necessary to use electrical signals in transmitting data between an optical device such as light emitting or receiving elements and, for example, a processor or a drive circuit. Thus, there has been a necessity for an optical communication technology with higher reliability considering even the quality of electrical signals transmitted between a processor and a drive circuit or between a drive circuit and an optical device. Therefore, according to an embodiment of the present disclosure, there is provided a novel and improved optical communication device, Reception apparatus, transmission apparatus, and transmission and reception system, capable of achieving higher reliability in optical communication.

According to an embodiment of the present disclosure, an optical communication device comprises: a drive circuit substrate having a first surface side and a second surface side opposite to the first surface side; and a first through via extending through the drive circuit substrate, the first through via being configured to electrically connect an optical element disposed on the first surface side of the drive circuit substrate to a drive circuit disposed on the second surface side of the drive circuit substrate.

The optical communication device may further comprise: a first lens attached to a lens substrate, the first lens facing a second lens that is disposed on the first surface side of the drive circuit substrate; and a positioning element attached to an interposer substrate, the positioning element being configured to align optical axes of the first and second lenses.

The optical communication device may further comprise: an interposer substrate, positioned above the second surface side of the drive circuit substrate; and a second through via extending through the interposer substrate, the second through via being configured to electrically connect the drive circuit to a signal processing circuit disposed on a signal processing substrate positioned above the interposer substrate. Additionally, the signal processing substrate can be vertically stacked above the interposer substrate, such that a wiring length to connect the signal processing circuit to the drive circuit through the second through via is substantially equal to a vertical thickness of the interposer substrate.

The optical communication device may further comprise a bypass capacitor formed in the interposer substrate and connected to the drive circuit. The bypass capacitor may comprise a first thin film and a second thin film formed in the interposer substrate, the first thin film being connected to a non-ground potential and the second thin film being connected to a ground potential.

The optical element can be a light receiving element or a light transmitting element.

According to an embodiment of the present disclosure, an optical communication device comprises: a signal processing substrate having a signal processing circuit and a drive circuit attached thereto, the signal processing circuit being electrically connected to the drive circuit on the signal processing substrate; an interposer substrate having a first surface side and a second surface side opposite to the first surface side; and a through via extending through the interposer substrate, the through via being configured to electrically connect an optical element disposed on the first surface side of the interposer substrate to the drive circuit in a region where the drive circuit is located on the signal processing substrate.

The region may further correspond to a position where the optical element is disposed. The signal processing substrate may further include another drive circuit that is electrically connected to the signal processing circuit on the signal processing substrate; and another through via extends through the interposer substrate and is configured to electrically connect a light transmitting element disposed on the first surface side of the interposer substrate to the other drive circuit in a region where the other drive circuit is located on the signal processing substrate.

According to an embodiment of the present disclosure, a reception system comprises: a signal processing circuit; a drive circuit substrate having a first surface side and a second surface side opposite to the first surface side; and a first through via extending through the drive circuit substrate, the first through via being configured to electrically connect a light receiving element disposed on the first surface side of the drive circuit substrate to a drive circuit disposed on the second surface side of the drive circuit substrate.

According to an embodiment of the present disclosure a transmission system comprises: a signal processing circuit; a drive circuit substrate having a first surface side and a second surface side opposite to the first surface side; and a first through via extending through the drive circuit substrate, the first through via being configured to electrically connect a light transmitting element disposed on the first surface side of the drive circuit substrate to a drive circuit disposed on the second surface side of the drive circuit substrate.

According to an embodiment of the present disclosure, there is provided an optical communication device including a first substrate configured to include an optical device disposed on a first surface of the first substrate, the optical device including at least one of a light receiving element and a light emitting element, and a drive circuit provided in a region corresponding to a position at which the optical device is disposed in a second surface located on an opposite side of the first surface of the first substrate and configured to drive the optical device. The drive circuit and the optical device are electrically connected to each other through a through via formed through the first substrate. The optical communication device further includes a signal processing substrate stacked over the second surface of the first substrate in a manner that the signal processing substrate having a signal processing circuit formed on the signal processing substrate covers at least a region corresponding to a position at which the optical device is disposed, the signal processing circuit being configured to perform a predetermined process on an electrical signal exchanged between the drive circuit and the signal processing circuit.

According to an embodiment of the present disclosure, there is provided a transmission apparatus including an optical communication device including a first substrate having a light emitting element disposed over a first surface of the first substrate, and a drive circuit provided in a region corresponding to a position at which the light emitting element is disposed over a second surface located on an opposite side of the first surface of the first substrate and configured to drive the light emitting element. The drive circuit and the light emitting element are electrically connected to each other in the optical communication device through a through via formed through the first substrate. The transmission apparatus further includes a signal processing substrate stacked over the second surface of the first substrate in a manner that the signal processing substrate having a signal processing circuit formed on the signal processing substrate covers at least a region corresponding to a position at which the light emitting element is disposed, the signal processing circuit being configured to perform a predetermined process on an electrical signal exchanged between the drive circuit and the signal processing circuit. The transmission apparatus transmits light to any apparatus through the optical communication device, the light having predetermined information superimposed on the light.

According to an embodiment of the present disclosure, there is provided a reception apparatus including an optical communication device including a first substrate having a light receiving element disposed over a first surface of the first substrate, and a drive circuit provided in a region corresponding to a position at which the light receiving element is disposed over a second surface located on an opposite side of the first surface of the first substrate and configured to drive the light receiving element. The drive circuit and the light receiving element are electrically connected to each other in the optical communication device through a through via formed through the first substrate. The reception apparatus further includes a signal processing substrate stacked over the second surface of the first substrate in a manner that the signal processing substrate having a signal processing circuit formed on the signal processing substrate covers at least a region corresponding to a position at which the light receiving element is disposed, the signal processing circuit being configured to perform a predetermined process on an electrical signal exchanged between the drive circuit and the signal processing circuit. The reception apparatus receives light transmitted from any apparatus through the optical communication device, the light having predetermined information superimposed on the light.

According to an embodiment of the present disclosure, there is provided a transmission and reception system including a transmission apparatus configured to include an optical communication device and configured to transmit light having predetermined information superimposed on the light to any apparatus through the optical communication device, the optical communication device including a first substrate configured to include an optical device disposed over a first surface of the first substrate, the optical device including at least one of a light receiving element and a light emitting element, and a drive circuit provided in a region corresponding to a position at which the optical device is disposed over a second surface located on an opposite side of the first surface of the first substrate and configured to drive the optical device, and a reception apparatus configured to include the optical communication device and to receive the light transmitted from the transmission apparatus through the optical communication device. The drive circuit and the optical device are electrically connected to each other in the optical communication device through a through via formed through the first substrate. The transmission and reception system further includes a signal processing substrate stacked over the second surface of the first substrate in the transmission apparatus and the reception apparatus in a manner that the signal processing substrate having a signal processing circuit formed on the signal processing substrate covers at least a region corresponding to a position at which the optical device is disposed, the signal processing circuit performing a predetermined process on an electrical signal exchanged between the drive circuit and the signal processing circuit.

According to an embodiment of the present disclosure, there is provided an optical communication device including a first substrate configured to include an optical device disposed on a first surface of the first substrate, the optical device including at least one of a light receiving element and a light emitting element, and a drive circuit provided in a region corresponding to a position at which the optical device is disposed in a second surface located on an opposite side of the first surface of the first substrate and configured to drive the optical device. The drive circuit and the optical device are electrically connected to each other through a through via formed through the first substrate. The optical communication device further includes a thin film capacitor formed in the first substrate or inside another substrate staked over the first substrate, the thin film capacitor being electrically connected between a power supply line and a ground line of the drive circuit and between a power supply line and a ground line of the optical device.

According to an embodiment of the present disclosure, there is provided a transmission apparatus including an optical communication device including a first substrate having a light emitting element disposed over a first surface of the first substrate, and a drive circuit provided in a region corresponding to a position at which the light emitting element is disposed over a second surface located on an opposite side of the first surface of the first substrate, and configured to drive the light emitting element. The drive circuit and the light emitting element are electrically connected to each other through a through via formed through the first substrate in the optical communication device. The transmission apparatus further includes a thin film capacitor formed in the first substrate or inside another substrate staked over the first substrate, the thin film capacitor being electrically connected between a power supply line and a ground line of the drive circuit and between a power supply line and a ground line of the light emitting element. The transmission apparatus transmits light to any apparatus through the optical communication device, the light having predetermined information superimposed on the light.

According to an embodiment of the present disclosure, there is provided a reception apparatus including an optical communication device including a first substrate having a light receiving element disposed over a first surface of the first substrate, and a drive circuit provided in a region corresponding to a position at which the light receiving element is disposed over a second surface located on an opposite side of the first surface of the first substrate, and configured to drive the light receiving element. The drive circuit and the light receiving element are electrically connected to each other through a through via formed through the first substrate in the optical communication device. The reception apparatus further includes a thin film capacitor formed in the first substrate or inside another substrate staked over the first substrate, the thin film capacitor being electrically connected between a power supply line and a ground line of the drive circuit and between a power supply line and a ground line of the light receiving element. The reception apparatus receives light transmitted from any apparatus through the optical communication device, the light having predetermined information superimposed on the light.

According to an embodiment of the present disclosure, there is provided a transmission and reception system including a transmission apparatus configured to include an optical communication device and configured to transmit light having predetermined information superimposed on the light to any apparatus through the optical communication device, the optical communication device including a first substrate configured to include an optical device disposed over a first surface of the first substrate, the optical device including at least one of a light receiving element and a light emitting element, and a drive circuit provided in a region corresponding to a position at which the optical device is disposed over a second surface located on an opposite side of the first surface of the first substrate and configured to drive the optical device, and a reception apparatus configured to include the optical communication device and to receive the light transmitted from the transmission apparatus through the optical communication device. The drive circuit and the optical device are electrically connected to each other through a through via formed through the first substrate in the optical communication device. The transmission and reception system further includes a thin film capacitor formed in the first substrate or inside another substrate staked over the first substrate in the transmission apparatus and the reception apparatus, the thin film capacitor being electrically connected between a power supply line and a ground line of the drive circuit and between a power supply line and a ground line of the optical device.

According to the embodiments of the present disclosure, the optical device is provided on one surface of the first substrate, the drive circuit for driving the optical device is provided on the other surface, and the optical device and the drive circuit are electrically connected to each other through the through via provided in the first substrate. In addition, the signal processing substrate having the signal processing circuit formed on the signal processing substrate is further stacked on the surface of the first substrate on which the drive circuit is provided. Furthermore, the drive circuit and the signal processing substrate are provided in a region corresponding to the position at which the optical device is disposed. Thus, the wiring length between the optical device and the drive circuit is reduced to the degree that the wiring length is substantially equal to the thickness (the depth of the through via) of the first substrate. In addition, the signal processing substrate and the drive circuit are provided in the region corresponding to the position at which the optical device is disposed in the same surface of the first substrate, and thus the wiring length between the drive circuit and the signal processing circuit formed on the signal processing substrate can be shortened. In this way, the wiring length through which electrical signals are transmitted and received during data transmission can be shortened, thereby reducing deterioration in electrical signals.

According to the embodiments of the present disclosure described above, it is possible to achieve higher reliability in optical communication. Note that the above technical advantages are not necessarily limited to those described herein, and in addition to or as an alternative to the technical advantages described above, any technical advantages described herein and other technical advantages understood from the present specification may be achievable.

BRIEF DESCRIPTION OF THE DRAWINGS

FIG. 15 is a diagram illustrating schematically an exemplary configuration in which the optical communication device according to the first and second embodiments is used in optical interconnect between processors mounted on a printed substrate.

DETAILED DESCRIPTION OF THE EMBODIMENT(S)

Figure 1:
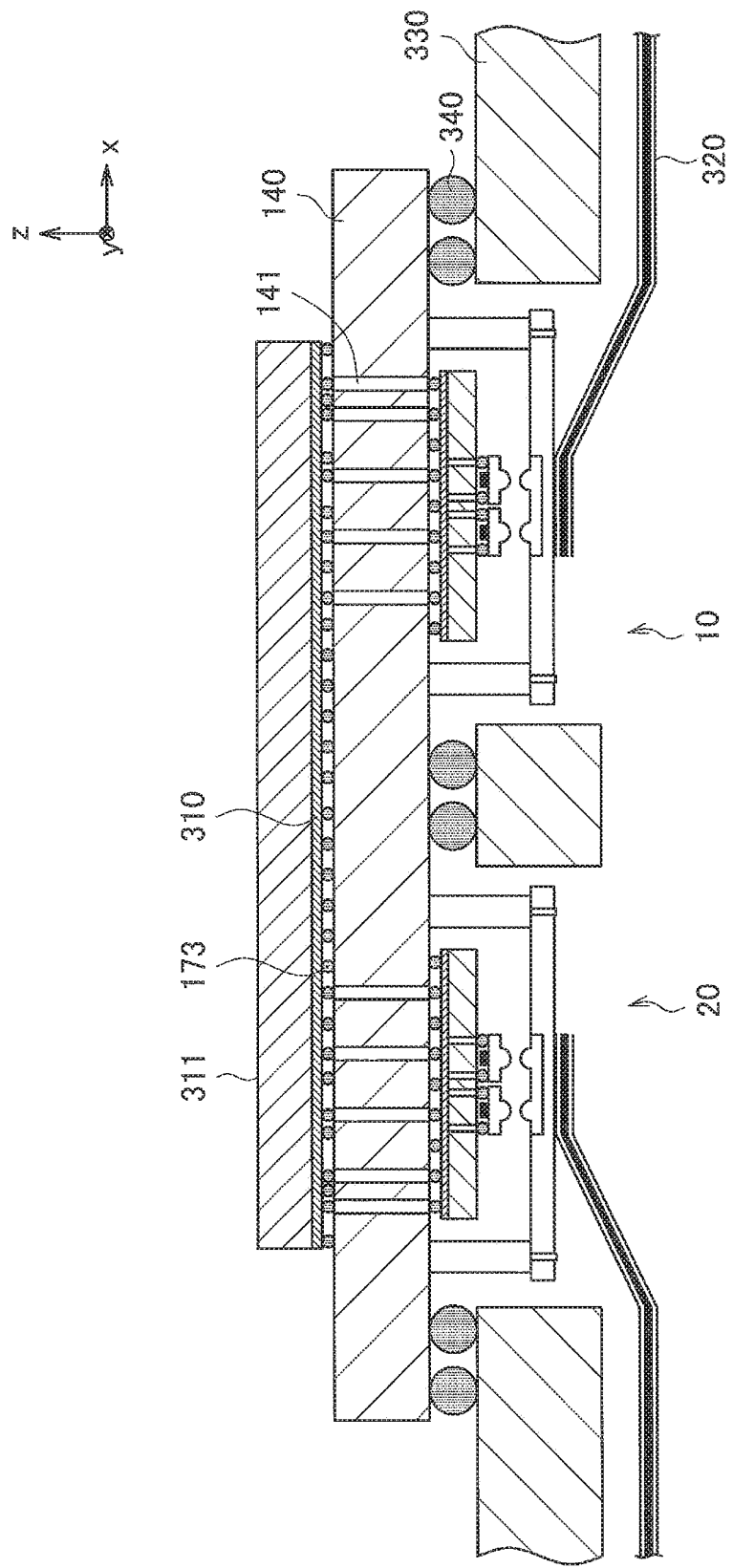
FIG. 1 is a sectional view schematically illustrating an exemplary configuration in which an optical communication device according to a first embodiment of the present disclosure is connected to a processor that transmits and receives various types of information through the optical communication device.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

The description will be made in the following order.
1. First Embodiment
   1-1. Configuration of optical communication device
   1-2. Comparison with general optical communication device
   1-3. Modification
      1-3-1. Modification having both transmitting and receiving functions
      1-3-2. Modification of forming processor and drive circuit on the same substrate
2. Second Embodiment
   2-1. Configuration of optical communication device
   2-2. Comparison with general optical communication device
   2-3. Modification
      2-3-1. Modification of adding thin-film capacitor to the first embodiment
   2-4. Mounting of bypass capacitor on substrate surface
3. Application
   3-1. Optical interconnect communication between processors on printed substrate
   3-2. Optical communication between apparatus
4. Supplement 1. First Embodiment The first embodiment of the present disclosure is now described.

As described above, in recent years, for processors such as CPUs used in computers, the improvements in their functionality and speed are progressing. For example, the calculation processing ability of a supercomputer is increasing in speed at the rate of increase that has doubled approximately every one and a half years, and a project to develop an exaflop-range supercomputer in the near future is also in progress. With such increase in the functionality and speed of a processor, noise is generated due to the fluctuation of power supply voltage caused by the simultaneous switching of transistors, and thus the reduction of occurrence of such noise is a major problem. In addition, to achieve a high-speed calculation, it is necessary for data input to and output from a processor to be performed at high speed. For example, a technology capable of transmitting a large amount of data at several terabits per second is expected to be developed.

However, the electrical interconnect technology that employs electrical signals between processors through copper wiring widely used today causes problems of RC signal delay, impedance mismatching, EMC/EMI, and crosstalk, which makes it difficult to further increase data transmission speed. Thus, the optical communication technology that modulates electrical signals into optical data and performs data transmission and reception using light has been developed as the data transmission technology that can be substituted for the electrical communication technology.

The transmission of data between processors using light is now described in more detail. At a transmission side, information subjected to various types of processing by a processor on the transmission side is transmitted as an electrical signal to a drive circuit for driving a light emitting element, and light having predetermined information superimposed thereon is emitted from the light emitting element by causing the drive circuit to drive the light emitting element based on the electrical signal. At a receiving side, the output from a light receiving element that receives the light having predetermined information superimposed thereon is transmitted as an electrical signal to a drive circuit for driving the light receiving element, and the electrical signal is transmitted from the drive circuit to a processor on the receiving side.

In this way, even when the transmission of data between processors is performed using light, the transmission of data between a processor and a drive circuit and between a drive circuit and a light emitting or receiving element (hereinafter, at least any one of a light emitting element and a light receiving element is also referred to as an optical device) is performed using an electrical signal. Accordingly, as described above, in order to achieve higher reliability in optical communication, it is necessary to improve the quality of electrical signals transmitted between a processor and a drive circuit and between a drive circuit and an optical device. In this case, in order to improve the quality of electrical signals, the length of wiring between a processor and a drive circuit and between a drive circuit and an optical device is preferably as short as possible. As the wiring length becomes longer, problems such as RC signal delay, impedance mismatching, EMC/EMI, and crosstalk become more evident, and this can cause degradation in quality of signal.

In general, a processor and a drive circuit are configured as separate chips. The processor and the drive circuit are individually mounted on, for example, a printed substrate. The processor and the drive circuit exchange electrical signals through a wiring pattern formed on the printed substrate (for more details, it will be described later in the item [1-2. Comparison with general optical communication device]). Thus, in a general configuration, the wiring length between a processor and a drive circuit tends to become longer, so there is room for improvement.

In view of the above circumstances, a technology for improving the quality of electrical signals in both the drive circuit and the processor has been desired by taking the length of wiring between the processor and the drive circuit and between the drive circuit and the optical device into consideration. According to the first embodiment of the present disclosure, there is provided a technology capable of achieving higher reliability in optical communication by improving the quality of electrical signals in a processor and a drive circuit for driving an optical device. The first embodiment will be described below in detail.

[1-1. Configuration of Optical Communication Device]

Figure 2:
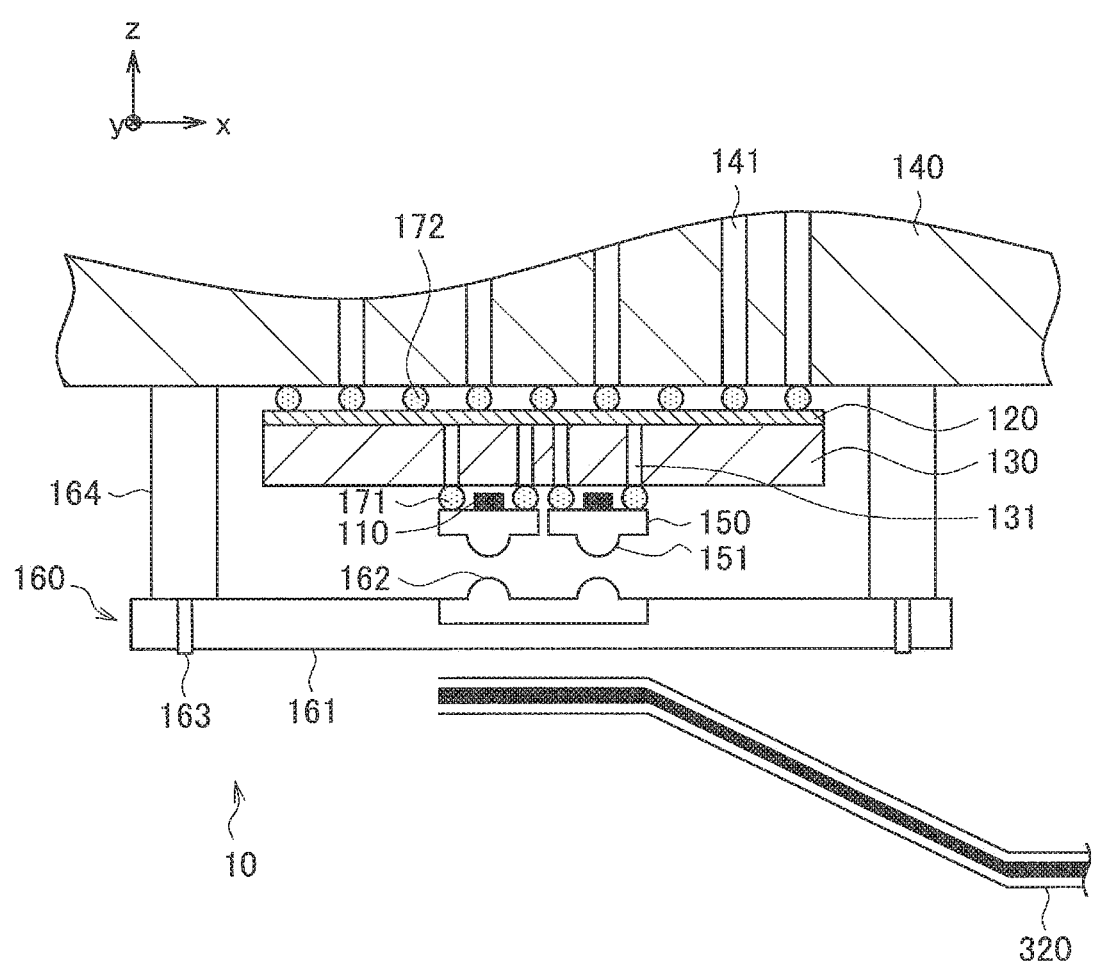
FIG. 2 is an enlarged sectional view illustrating the optical communication device according to the first embodiment shown in FIG. 1.

The configuration of an optical communication device according to the first embodiment of the present disclosure is now described with reference to FIGS. 1 and 2. FIG. 1 is a sectional view illustrating an exemplary configuration in which an optical communication device according to the first embodiment of the present disclosure is connected to a processor that transmits and receives various types of information through the optical communication device. FIG. 2 is an enlarged sectional view illustrating the optical communication device according to the first embodiment shown in FIG. 1.

The optical communication device according to the first embodiment of the present disclosure is a communication interface that performs a photoelectric conversion between electrical and optical signals to perform data transmission between processors using light. Specifically, an optical communication device on a transmitting side converts electrical signals into optical signals, and transmits converted optical signals to an optical communication device on a receiving side. The electrical signals are subjected to a predetermined process by a processor and are superimposed with predetermined information. The receiving-side optical communication device converts the optical signals having predetermined information superimposed thereon into electrical signals and supplies the electrical signals to a processor. FIG. 1 illustrates how the optical communication devices on the receiving and transmitting sides are connected to a processor.

Referring to FIG. 1, a printed substrate 330, an interposer substrate 140, and a signal processing substrate 311 are stacked on one another in this order, and the signal processing substrate 311 has a processor 310 formed on the signal processing substrate 311. The printed substrate 330 and the interposer substrate 140 are electrically connected to each other, for example, by a solder bump 340 through a pad on the printed substrate 330 and a pad on the interposer substrate 140. In addition, the interposer substrate 140 and the signal processing substrate 311 are electrically connected to each other, for example, by a solder bump 173 through a pad on the interposer substrate 140 and a pad on the signal processing substrate 311.

In the following description, in the drawings, the direction in which the printed substrate 330, the interposer substrate 140, and the processor 310 are stacked is defined as the z-axis direction. Additionally, in the z-axis direction, the direction in which the printed substrate 330, the interposer substrate 140, and the processor 310 are stacked in this order is defined as the positive direction of the z-axis, and then the positive direction and the negative direction of the z-axis are referred to as the upper direction and the lower direction, respectively, for the sake of convenience. Furthermore, in a plane perpendicular to the z-axis direction, two directions orthogonal to each other are respectively defined as the x-axis direction and the y-axis direction.

Optical communication devices 10 and 20 are configured by forming an opening portion in a partial region of the printed substrate 330 and providing a light receiving element 110 and a light emitting element in the position of the interposer substrate 140 corresponding to the opening portion. The light receiving element 110 and the light emitting element are optical devices. One of the optical communication devices 10 and 20 shown in FIG. 1 may be the receiving-side optical communication device 10, and the other may be the transmitting-side optical communication device 20. The optical communication devices 10 and 20 are connected to optical communication devices 10 and 20 of another processor 310 (not shown), for example, through a light guide member 320 at the rear surface of the printed substrate 330.

The processor 310 is an example of a signal processing circuit that performs predetermined processing on electrical signals. The processor 301 includes an input/output interface (an I/O part) and is electrically connected to the interposer substrate 140 by the solder bump 173 through a pad provided on the I/O part. The processor 310 may be one of various arithmetic logic units such as a CPU and a digital signal processor (DSP). However, the first embodiment is not limited to this example, and a signal processing circuit that does not have a function as a typical processor may be connected to the optical communication devices 10 and 20. In the first embodiment, an integrated circuit for performing predetermined signal processing, such as large scale integration (LSI) or application specific integrated circuit, may be connected to the optical communication devices 10 and 20 and then may perform data transmission using light with another signal processing circuit through the optical communication devices 10 and 20.

The light guide member 320 is an example of an optical member that propagates light in the predetermined direction. The light guide member 320 may be, for example, an optical fiber and a light guide plate. In the first embodiment, types of the light guide member 320 are not limited, and any type of optical members that can be commonly used for propagation of light in optical communication may be used as the light guide member.

The configuration of the optical communication devices 10 and 20 is now described in more detail with reference to FIG. 2. FIG. 2 illustrates the receiving-side optical communication device 10 of the receiving-side and transmitting-side optical communication devices 10 and 20. In the first embodiment, the receiving-side optical communication device 10 and the transmitting-side optical communication device 20 are different from each other only in types of an optical device (that is, either light receiving element or light emitting element) and in configuration of the drive circuit for driving the optical device, but other configurations are similar. Thus, the configuration of the optical communication devices 10 and 20 according to the first embodiment will be described based on the configuration of the receiving-side optical communication device 10 shown in FIG. 2.

Referring to FIG. 2, the optical communication device 10 according to the first embodiment includes a drive circuit substrate 130 and a drive circuit 120. The drive circuit substrate 130 is provided with the light receiving element 110 on a first surface side of the drive circuit substrate 130. The drive circuit 120 is provided in a region, which corresponds to the position where the light receiving element 110 is disposed, on a second surface side located on the opposite side of the first surface side of the drive circuit substrate 130, and the drive circuit 120 is used to drive the light receiving element 110. In addition, the drive circuit 120 and the light receiving element 110 are electrically connected to each other by a through via 131 formed through the drive circuit substrate 130.

The light receiving element 110 is an optical element that generates a signal value corresponding to the received light. The light receiving element 110 is, for example, a photodiode (PD). The transmitting-side optical communication device 20 is provided with a light emitting element rather than the light receiving element 110. The light emitting element is an optical element that emits light having an intensity corresponding to an applied current value. The light emitting element is, for example, a semiconductor laser, and more specifically, a vertical cavity surface emitting laser (VCSEL). The light receiving element 110 and the light emitting element used in the first embodiment are not limited to these examples, and any type of light receiving elements and light emitting elements that can be commonly used in optical communication may be employed.

The drive circuit 120 is a circuit for driving the light receiving element 110. Specifically, the drive circuit 120 may be configured to include a trans-impedance amplifier (TIA) for amplifying a signal value generated by the light receiving element 110. The transmitting-side optical communication device 20 is provided with another drive circuit for driving the light emitting element, instead of the drive circuit 120. The other drive circuit for driving the light emitting element may include, for example, a laser diode driver (LDD) for driving a laser diode that is a light emitting element. In the optical communication devices 10 and 20 according to the first embodiment, the configuration of the drive circuit for driving the light receiving element 110 and the light emitting element may be optional, and may be designed appropriately depending on the configuration of the light receiving element 110 and the light emitting element. Configurations of any type of drive circuits that can be commonly used in optical communication may be employed as the configuration of the drive circuit for driving the light receiving element 110 and the light emitting element, and thus a detailed description thereof will be omitted. The drive circuit for driving the light receiving element 110 and the light emitting element is also referred to as a front-end IC (FEIC) hereinafter.

As shown in FIGS. 1 and 2, the interposer substrate 140 is stacked over the drive circuit substrate 130 so that the interposer substrate 140 faces the drive circuit 120. Then, the drive circuit 120 on the drive circuit substrate 130 and the interposer substrate 140 are electrically connected to each other by a solder bump 172.

Moreover, as shown in FIG. 1, the signal processing substrate 311 is stacked over the interposer substrate 140 in the state where the processor 310 faces the interposer substrate 140. Then, the processor 310 on the signal processing substrate 311 and the interposer substrate 140 are electrically connected to each other by the solder bump 173.

The signal processing substrate 311 having the processor 310 formed thereon is stacked over the interposer substrate 140 so that the signal processing substrate 311 covers at least a region corresponding to the position at which the light receiving element 110 is disposed. The processor 310 and the drive circuit 120 are electrically connected to each other through a through via 141 formed through the interposer substrate 140. The signal processing substrate 311 is stacked, for example, so that the I/O part of the processor 310 may be disposed directly above the position at which the light receiving element 110 is disposed. Thus, in the example shown in FIG. 1, the I/O part of the processor 310 is electrically connected to the drive circuit 120 through the through via 141, and thus various types of information can be exchanged as electrical signals between the processor 310 and the drive circuit 120.

In this way, in the first embodiment, the drive circuit substrate 130 having the drive circuit 120 formed thereon, the interposer substrate 140, and the signal processing substrate 311 having the processor 310 formed thereon are stacked on one another in this order. In addition, the drive circuit 120 and the signal processing substrate 311 are provided in a region corresponding to the position at which the light receiving element 110 is disposed. The light receiving element 110 provided on the first surface side of the drive circuit substrate 130 and the drive circuit 120 provided on the second surface side of the drive circuit substrate 130 are electrically connected to each other through the through via 131 formed in the drive circuit substrate 130. The drive circuit 120 provided on the second surface side of the drive circuit substrate 130 is electrically connected to the processor 310 formed on the signal processing substrate 311 through the through via 141 provided in the interposer substrate 140.

A lens substrate 150 is provided in the first surface of the drive circuit substrate 130 to cover the light receiving element 110. The lens substrate 150 (hereinafter also referred to as a first lens substrate) includes a plurality of lenses 151 (hereinafter also referred to as a first lens) formed in a two dimensional array. The plurality of lenses 151 are provided at the respective positions corresponding to the position where the light receiving element 110 is disposed, and thus light collected by the lens 151 is incident on the light receiving element 110. In the first embodiment, as shown in FIG. 2, the light receiving element 110 is disposed on the lens substrate 150 so that the light receiving element 110 is electrically connected to the lens substrate 150, for example, by a solder bump. In addition, the lens substrate 150 is electrically connected to the drive circuit 120 through the through via 131 by a solder bump 171. In this way, in the first embodiment, the light receiving element 110 is electrically connected to the drive circuit 120 through the lens substrate 150, the solder bump 171, and the through via 131. The present embodiment is not limited to this example, and the light receiving element 110 may be mounted on the drive circuit substrate 130 and then may be electrically connected to the drive circuit 120 more directly through the through via 131.

An optical input/output unit 160 is provided to face the lens substrate 150. The optical input/output unit 160 causes light propagated through the light guide member 320 to be incident on the light receiving element 110 through the lens 151 on the lens substrate 150. In addition, in the transmitting-side optical communication device 20, the optical input/output unit 160 causes light emitted from a light emitting element to be outputted to the light guide member 320 through the lens 151 on the lens substrate 150.

Specifically, the optical input/output unit 160 includes a lens substrate 161 (hereinafter also referred to as a second lens substrate) and a plurality of lenses 162 (hereinafter also referred to as a second lens) provided on the lens substrate 161. The plurality of lenses 162 are provided at the respective positions facing the lens 151 of the lens substrate 150. The light propagated through the light guide member 320 is diffused by the lens 162, is collected by the lens 151, and then is incident on the light receiving element 110. In the transmitting-side optical communication device 20, the light emitted from a light emitting element is diffused by the lens 151, is collected by the lens 162, and then is outputted to the light guide member 320. In this way, the input and output of light through the lenses 151 and 162 can reduce optical attenuation (loss) at the time of light incidence from the light guide member 320 and light emission to the light guide member 320.

The lens substrate 161 is connected to the interposer substrate 140 by using a positioning pin 164. Specifically, the positioning pin 164 has one end that is connected to the lower surface of the interposer substrate 140, for example, by soldering and the other end that is fitted to a fitting part 163 provided in the lens substrate 161. Thus, the lens substrate 161 and the interposer substrate 140 are connected to each other through the positioning pin 164.

It can be said that the connection position of the positioning pin 164 to the lens substrate 161 and the interposer substrate 140 determines the position of the lens 162 relative to the lens 151. As described above, in the first embodiment, light is exchanged between the light receiving element 110 and the light guide member 320 through the lenses 151 and 162. Thus, it is preferable that the lens 151 and the lens 162 provided to face each other are located so that the amount of displacement between their optical axes is set as small as possible. As the amount of displacement between optical axes of the lenses 151 and 162 becomes larger, the loss of light between the lenses 151 and 162 increases, which results in a decrease in reliability in optical communication.

In the first embodiment, when one end of the positioning pin 164 connects to the interposer substrate 140, its connection position is determined by using a pad or the like formed on the lower surface of the interposer substrate 140 as an alignment pattern (hereinafter referred to as a first alignment pattern). The connection of the positioning pin 164 and the interposer substrate 140 uses, for example, a solder connection, and the alignment of the connection position of the positioning pin 164 relative to the interposer substrate 140 is performed in a self-aligned manner with respect to the first alignment pattern. In addition, the other end of the positioning pin 164 is fitted to the fitting part 163 formed on the lens substrate 161 of the optical input/output unit 160, and thus the fitting part 163 can be formed to be aligned with respect to the first alignment pattern. Furthermore, the drive circuit 120 provided in the drive circuit substrate 130 is connected to the interposer substrate 140 by allowing the drive circuit 120 to be self-aligned with respect to a pad formed together with the first alignment pattern by the solder bump 172.

Moreover, the lens substrate 150 is connected to the drive circuit substrate 130 by allowing the lens substrate 150 to be aligned in a self-aligned manner by the solder bump 171 with respect to the through via 131 formed in the drive circuit substrate 130 together with an alignment pattern provided on the drive circuit 120 (hereinafter referred to as a second alignment pattern). In addition, the light receiving element 110 is connected to the lens substrate 150 by allowing the light receiving element 110 is aligned in a self-aligned manner with respect to the lens substrate 150 by a solder bump.

Thus, in the first embodiment, the alignment in the plane of the drive circuit substrate 130 and the lens substrate 161 may be performed based on the first alignment pattern provided on the surface of the interposer substrate 140, and the alignment in the plane of the lens substrate 150 may be performed based on the second alignment pattern provided in the drive circuit 120 on the drive circuit substrate 130. Accordingly, the alignment between an optical axis of the lens 151 formed on the lens substrate 150 and an optical axis of the lens 162 formed on the lens substrate 161 can be achieved with high accuracy, thereby reducing the amount of displacement between these optical axes. Furthermore, in the first embodiment, the alignment for the connection between the positioning pin and the interposer substrate 140, the connection between the interposer substrate 140 and the drive circuit substrate 130, the connection between the drive circuit substrate 130 and the lens substrate 150, and the connection between the lens substrate 150 and the light receiving element 110 can be performed in a self-aligned manner by a solder connection, thereby carrying out these alignments with ease and high accuracy. Thus, the alignment between the optical axis of the lens 151 and the optical axis of the lens 162 can be performed with higher accuracy, and the alignment with respect to the lenses 151 and 162 of the light receiving element 110 can be controlled with high accuracy.

The configuration of the optical communication devices 10 and 20 according to the first embodiment has been described above with reference to FIGS. 1 and 2. Only two light receiving elements 110 are illustrated in FIGS. 1 and 2 for simplicity, but in practice, light receiving elements and light emitting elements as many as the number of channels to be used in optical communication may be provided in the optical communication devices 10 and 20 according to the first embodiment.

Figure 3:
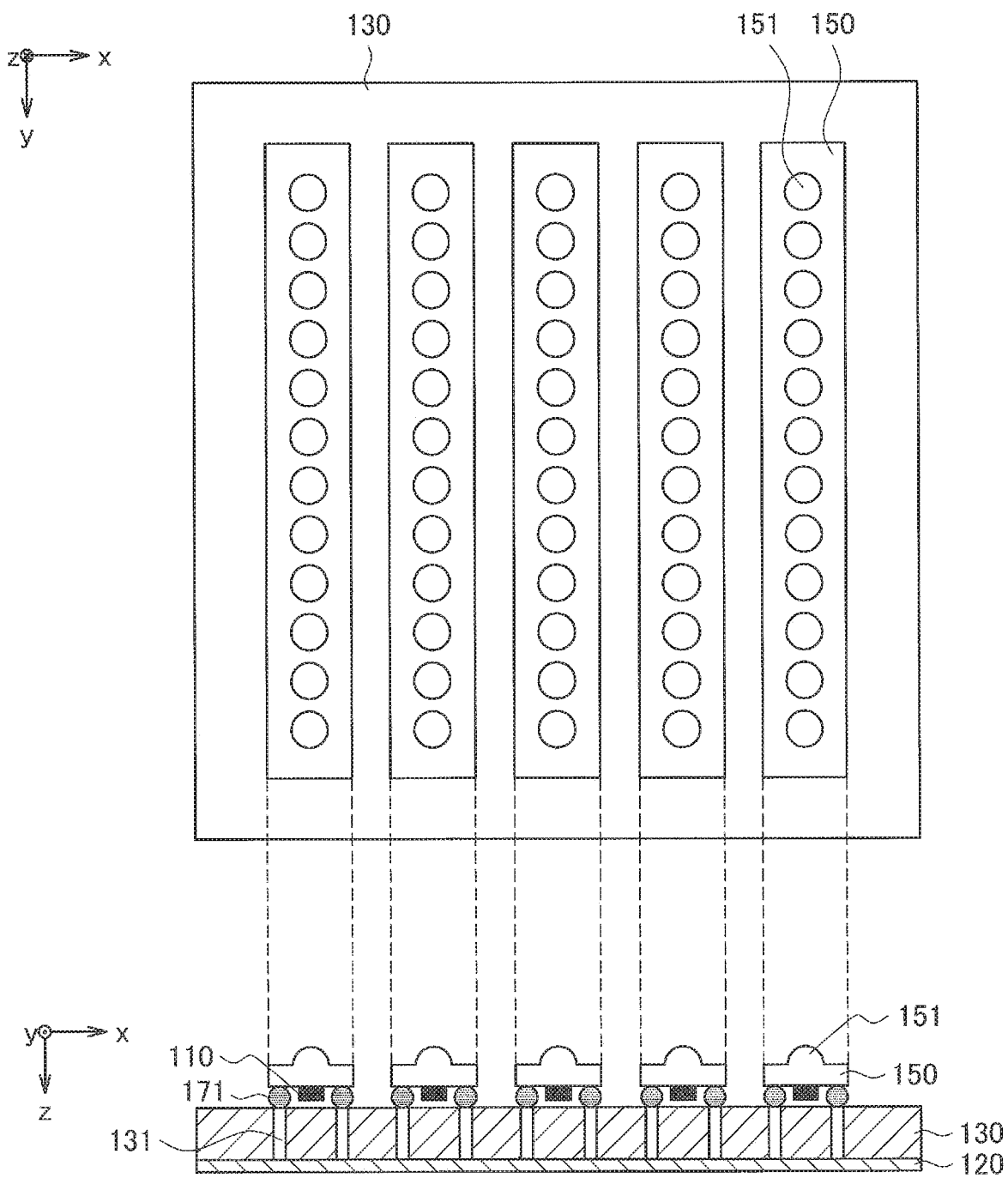
FIG. 3 a diagram illustrating schematically an exemplary configuration of a light receiving element and a lens substrate when there are a larger number of channels in the first embodiment.

The configuration of the light receiving element 110 and the lens substrate 150 when there are a larger number of channels as described above will be described with reference to FIG. 3. FIG. 3 a diagram illustrating schematically an exemplary configuration of the light receiving element 110 and the lens substrate 150 when there are a larger number of channels in the first embodiment. FIG. 3 illustrates a front elevation view of the first surface of the drive circuit substrate 130, that is, the surface on which the light receiving element 110 and the lens substrate 150 are disposed and, at the same time, illustrates a sectional view of the drive circuit substrate 130, the light receiving element 110, and the lens substrate 150.

FIG. 3 illustrates the configuration of the light receiving element 110 and the lens substrate 150 in the receiving-side optical communication device 10 including, for example, 60 channels. Referring to FIG. 3, 60 light receiving elements 110 corresponding to the number of channels are arranged two-dimensionally on the drive circuit substrate 130. In addition, 60 lenses 151 corresponding respectively to the light receiving elements 110 are provided on the lens substrate 150. In the example shown in FIG. 3, five rows of light receiving elements are arranged, with each row containing 12 light receiving elements 110. As shown in FIG. 3, the lens substrate 150 may be provided to be divided into each row of the light receiving elements.

In this way, in the first embodiment, the light receiving element 110 that corresponds in number to the channels in the optical communication devices 10 and 20 may be two-dimensionally disposed on one surface side of the drive circuit substrate 130. The number and arrangement of the light receiving elements 110 are not limited to the example shown in FIG. 3, and may be determined appropriately considering the number of the light receiving elements 110 to be used in optical communication, the connection with the light guide member 320, or the like.

Furthermore, in the first embodiment, a plurality of light receiving elements 110 are prepared as individual component parts and are connected to the corresponding position of the respective lens substrates 150, and thus the light receiving element 110, for example, having an array arrangement as shown in FIG. 3 may be configured. Configuring an array of the light receiving elements 110 by arranging them individually can improve the yield compared to the case of fabricating the array of the light receiving elements 110 in a lump, so it is possible to reduce the cost of fabricating the optical communication device 10.

[1-2. Comparison with General Optical Communication Device]

Figure 4:
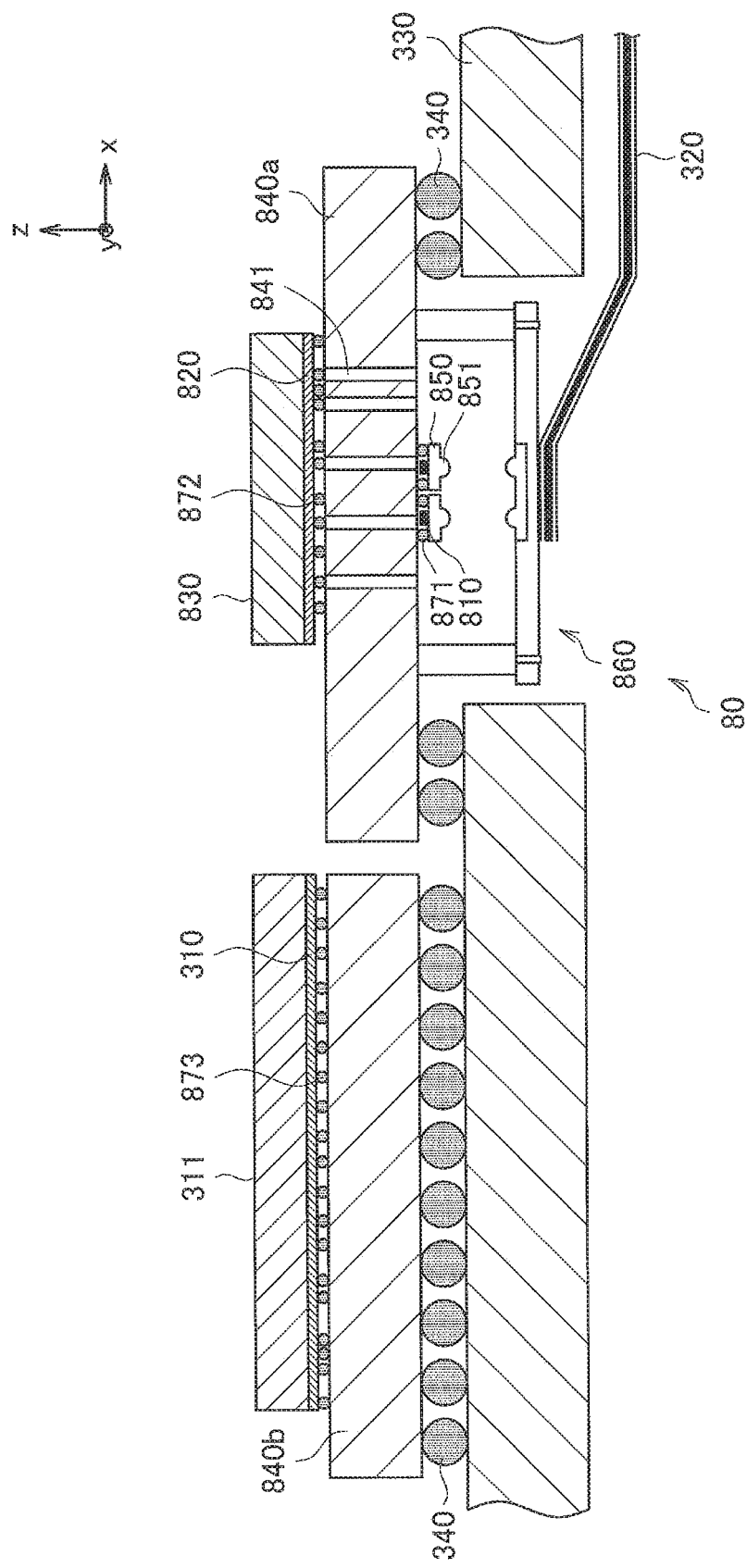
FIG. 4 is a sectional view illustrating schematically the configuration in which a general optical communication device is connected to a processor that transmits and receives various types of information through the general optical communication device.

In order to make the first embodiment of the present disclosure more specific, the optical communication devices 10 and 20 according to the first embodiment compares with a general optical communication device. The configuration of a general optical communication device is now described with reference to FIG. 4. FIG. 4 is a diagram corresponding to FIG. 1, and is a sectional view illustrating schematically the configuration in which a general optical communication device is connected to a processor that transmits and receives various types of information through the general optical communication device. FIG. 4 illustrates the configuration of an optical communication device on the receiving side as an example of general optical communication devices. The configuration of a general optical communication device on the transmitting side and the configuration of a general optical communication device on the receiving side are different from each other only in types of an optical device (that is, either light receiving element or light emitting element) and in configuration of a drive circuit for driving the optical device, but other configurations are similar. Thus, the configuration of a general optical communication device will be described based on the configuration of an optical communication device on the receiving side shown in FIG. 4.

Referring to FIG. 4, a printed substrate 330, an interposer substrate 840a, and a drive circuit substrate 830 are stacked on one another in this order. The drive circuit substrate 830 is provided with a drive circuit 820 formed thereon for driving a light receiving element 810. The printed substrate 330 and the interposer substrate 840a are electrically connected to each other, for example, by a solder bump 340 through a pad on the printed substrate 330 and a pad on the interposer substrate 840a. In addition, the interposer substrate 840a and the drive circuit substrate 830 are electrically connected to each other for example by a solder bump 872 through a pad on the interposer substrate 840a and a pad on the drive circuit substrate 830.

An optical communication device 80 is configured by forming an opening portion in a partial region of the printed substrate 330 and providing a light receiving element 810, which is an optical device, in the interposer substrate 840a at a position corresponding to the opening portion. The optical communication device 80 is connected to an optical communication device 80 connected to another processor 310 (not shown), for example, through a light guide member 320 at the rear surface of the printed substrate 330.

As shown in FIG. 4, the general optical communication device 80 includes the interposer substrate 840a and the drive circuit 820. The interposer substrate 840a is provided with the light receiving element 810 that is an optical device formed on the first surface side of the interposer substrate 840a. The drive circuit 820 is provided in a region, which corresponds to the position where the light receiving element 810 is disposed, on a second surface side located on an opposite side of the first surface of the interposer substrate 840a, and the drive circuit 820 is used to drive the light receiving element 810. Specifically, the drive circuit substrate 830 is stacked over the upper surface of the interposer substrate 840a in the state where the drive circuit 820 faces the interposer substrate 840a, and the drive circuit 820 is electrically connected to the interposer substrate 840a by the solder bump 872. In addition, the light receiving element 810 and the drive circuit 820 are electrically connected to each other through a through via 841 formed through the interposer substrate 840a.

The light receiving element 810 corresponds to the light receiving element 110 shown in FIGS. 1 and 2. In addition, the drive circuit 820 corresponds to the drive circuit 120 shown in FIGS. 1 and 2. The light receiving element 810 and the drive circuit 820 may be respectively similar in configuration to the light receiving element 110 and the drive circuit 120 described above, and thus a detailed description thereof will be omitted. In a general optical communication device on the transmitting side, a light emitting element is provided instead of the light receiving element 810. In addition, a drive circuit for driving the light emitting element may be provided instead of the drive circuit 120. The light emitting element and the drive circuit for driving the light emitting element are also similar in configuration to the light emitting element and the drive circuit used in the transmitting-side optical communication device 20 according to the first embodiment described above, and thus a detailed description thereof will be omitted.

A lens substrate 850 having a plurality of lenses 851 formed thereon in a two-dimensional manner is provided on the first surface of the interposer substrate 840a so that the lens substrate 850 covers a plurality of light receiving elements 810. The plurality of lenses 851 are provided at the respective positions corresponding to the positions where the plurality of light receiving elements 810 are disposed, and light collected by the lens 851 is incident on the light receiving element 810. As shown in FIG. 4, the light receiving element 810 is disposed on the lens substrate 850 so that the light receiving element 810 is electrically connected to the lens substrate 850, for example, by a solder bump. In addition, the lens substrate 850 is electrically connected to the drive circuit 820 through the through via 841 by a solder bump 871. In this way, the light receiving element 810 is electrically connected to the drive circuit 820 through the lens substrate 850, the solder bump 871, and the through via 841.

An optical input/output unit 860 is provided to face the lens substrate 850. The optical input/output unit 860 causes light propagated through a light guide member 320 to be incident on the light receiving element 810 through the lens 851 on the lens substrate 850. In addition, in a general optical communication device on the transmitting side, the optical input/output unit 860 causes light emitted from a light emitting element to be outputted to the light guide member 320 through the lens 851 on the lens substrate 850. The configuration of the optical input/output unit 860 is similar to that of the optical input/output unit 160 shown in FIGS. 1 and 2, and thus a detailed description thereof will be omitted.

Furthermore, as shown in FIG. 4, in a general configuration, the printed substrate 330, an interposer substrate 840*b*, and a signal processing substrate 311 are stacked on one another in this order. The interposer substrate 840*b* is different from the interposer substrate 840*a*. The signal processing substrate 311 is provided with a processor 310 formed thereon. The printed substrate 330 and the interposer substrate 840*b* are electrically connected to each other, for example, by a solder bump 340 through a pad on the printed substrate 330 and a pad on the interposer substrate 840*b*. In addition, the interposer substrate 840*b* and the signal processing substrate 311 are electrically connected to each other, for example, by a solder bump 873 through a pad on the interposer substrate 840*b* and a pad on the signal processing substrate 311.

Specifically, the signal processing substrate 311 is stacked on the interposer substrate 840*b* in the state where the processor 310 faces the interposer substrate 840*b*. Then, the interposer substrate 840*b* is electrically connected, for example, to an I/O part of the processor 310 by the solder bump 873.

As described above, the interposer substrate 840*a* on which the drive circuit substrate 830 is stacked and the interposer substrate 840*b* on which the signal processing substrate 311 is stacked are electrically connected to the respective printed substrates 330 by the solder bump 340. In such a general configuration, the processor 310 and the drive circuit 820 are stacked as separate component parts on the interposer substrates 840*b* and 840*a*, respectively, and they are electrically connected to each other through the printed substrate 330. Thus, in such a general configuration, electrical signals exchanged between the processor 310 and the drive circuit 820 are transmitted and received through the interposer substrate 840*b*, the printed substrate 330, and the interposer substrate 840*a*, which leads to a relatively long wiring length. When the data is transmitted at a further higher speed in the case where data transmission between the processors 310 is performed using light, if the wiring length between the processor 310 and the drive circuit 820 is relatively long, then problems such as RC signal delay, impedance mismatching, EMC/EMI, and crosstalk are more evident, so the quality of electrical signals may be deteriorated. The deterioration in the quality of electrical signals may lead to decreased reliability in optical communication.

On the other hand, as described with reference to FIGS. 1 and 2, in the first embodiment, the light receiving element 110 is provided on one surface of the drive circuit substrate 130, and the drive circuit 120 for driving the light receiving element 110 is provided on the other surface of the drive circuit substrate 130. In addition, the interposer substrate 140 is stacked on the drive circuit substrate 130 so that the interposer substrate 140 faces the drive circuit 120, and the signal processing substrate 311 is stacked on the interposer substrate 140 so that the processor 310 faces the interposer substrate 140. The drive circuit 120 and the signal processing substrate 311 are provided in the region corresponding to the position where the light receiving element 110 is disposed. Then, the light receiving element 110 and the drive circuit 120 are electrically connected to each other through the through via 131 formed through the drive circuit substrate 130. The drive circuit 120 formed on the drive circuit substrate 130 and the processor 310 formed on the signal processing substrate 311 are electrically connected to each other through the through via 141 formed through the interposer substrate 140. In this way, in the first embodiment, the wiring length that is necessary to connect between the processor 310 and the drive circuit 120 can be substantially equal to the thickness of the interposer substrate 140 (the depth of the through via 141). In addition, the wiring length that is necessary to connect between the drive circuit 120 and the light receiving element 110 can be substantially equal to the thickness of the drive circuit substrate 130 (the depth of the through via 131). Accordingly, the length of wiring through which electrical signals are transmitted and received during transmission of data can be made to be shorter than that of a general configuration illustrated in FIG. 4, and thus it is possible to reduce the deterioration of electrical signals, such as voltage drop and high frequency crosstalk. Therefore, high reliability in optical communication can be achieved.

[1-3. Modification]

There will be described below some of modifications of the first embodiment. The first embodiment may employ configurations as described below.

(1-3-1. Modification Having Both Transmitting and Receiving Functions)

In the first embodiment described above, the optical communication devices 10 and 20 include any of a light receiving element and a light emitting element as an optical device, and are configured to have any one of data transmitting and receiving functions. However, the first embodiment is not limited to this example, and an optical communication device may have both the data transmitting and receiving functions.

Figure 5:
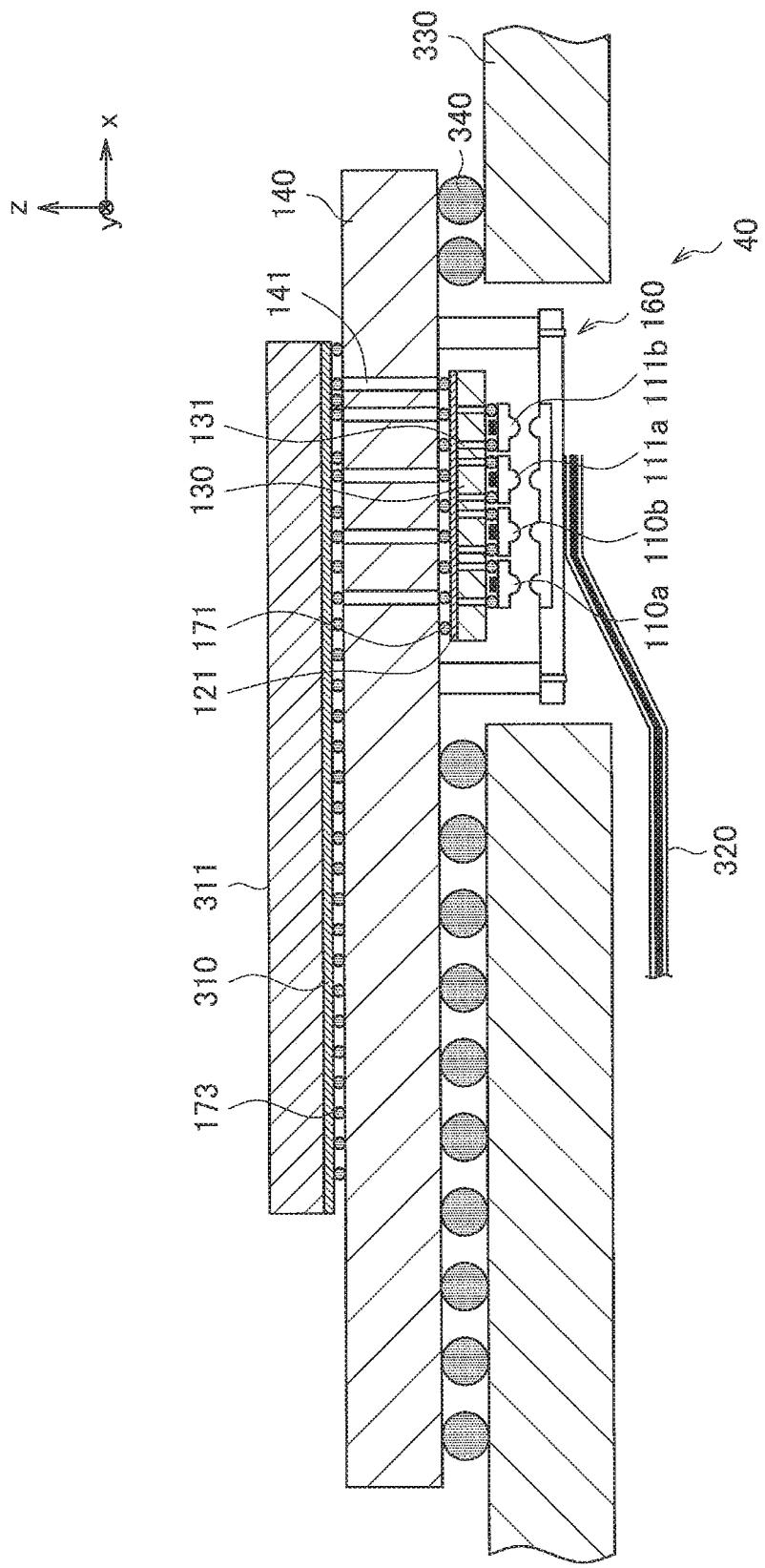
FIG. 5 is a sectional view illustrating schematically the configuration in which an optical communication device having both the data transmitting and receiving functions according to a modification is connected to a processor that transmits and receives various types of information through the optical communication device.

A modification having both the data transmitting and receiving functions in the first embodiment will be described with reference to FIG. 5. FIG. 5 is a sectional view illustrating schematically the configuration in which an optical communication device according to the modification having both the data transmitting and receiving functions is connected to a processor that transmits and receives various types of information through the optical communication device.

Referring to FIG. 5, an optical communication device 40 according to the present modification includes a drive circuit substrate 130 and a drive circuit 121. The drive circuit substrate 130 is provided with light receiving elements 110*a* and 110*b* and light emitting elements 111*a* and 111*b* formed on a first surface side of the drive circuit substrate 130, and the light receiving and emitting elements are optical devices. The drive circuit 121 is formed on a second surface side located on the opposite side of the first surface side of the drive circuit substrate 130, and the drive circuit 121 is used to drive the light receiving elements 110*a* and 110*b* and the light emitting elements 111*a* and 111*b*. In addition, the drive circuit substrate 130 has a through via 131 formed through the drive circuit substrate 130. The drive circuit 121 is electrically connected to the light receiving elements 110*a* and 110*b* and the light emitting elements 111*a* and 111*b* through the through via 131.

In the present modification, the optical communication device 40 further includes the light emitting elements 111*a* and 111*b*, and the drive circuit 121 is configured to drive not only the light receiving elements 110*a* and 110*b* but also the light emitting elements 111*a* and 111*b*. This configuration is different from the optical communication device 10 according to the first embodiment described above. Other configurations of the optical communication device 40 may be similar to the optical communication device 10, and thus a detailed description of similar configurations to the optical communication device 10 will be omitted.

When the drive circuit 121 drives appropriately the light emitting elements 111*a* and 111*b*, the optical communication device 40 can convert an electrical signal subjected to a predetermined process by the processor 310 into an optical signal and transmit it to another processor 310. In addition, the optical communication device 40 receives light on which predetermined information is superimposed by the light receiving elements 110*a* and 110*b*, and supplies it to the processor 310 as an electrical signal through the drive circuit 121, thereby receiving data transmitted from the other processor 310. In this way, the optical communication device 40 according to the present modification can both transmit and receive data using light. The drive circuit 121 is configured to both transmit and receive data and thus can drive all the light receiving elements 110*a* and 110*b* and the light emitting elements 111*a* and 111*b*.

FIG. 5 illustrates only two light receiving elements 110*a* and 110*b* and only two light emitting elements 111*a* and 111*b* for simplicity, but in practice, the light receiving and emitting elements as many as the number of channels to be used in optical communication may be provided in the optical communication device 40 according to the present modification. For example, a light emitting element is disposed in a channel for data transmission of a plurality of channels, and a light receiving element is disposed in a channel for data reception of a plurality of channels.

The modification having both the transmitting and receiving functions has been described with reference to FIG. 5. As described above, the optical communication device 40 according to the present modification further includes the light emitting elements 111*a* and 111*b*, and the drive circuit 121 is configured to drive not only the light receiving elements 110*a* and 110*b* but also the light emitting elements 111*a* and 111*b*. This is different from the optical communication device 10 according to the first embodiment described above. Accordingly, like the optical communication device 10, the length of wiring through which electrical signals are transmitted and received between the processor 310 and the drive circuit 120 and between the drive circuit 120 and the light receiving element 110 during transmission of data can be made to be shorter, and thus it is possible to reduce the deterioration of electrical signals. Therefore, high reliability in optical communication can be achieved. Moreover, the optical communication device 40 according to the present modification includes the light receiving elements 110*a* and 110*b* and the light emitting elements 111*a* and 111*b*, and also have both the data receiving and transmitting functions. Thus, it is possible to reduce the processing and space necessary for connection of the optical communication device, compared with the case where an optical communication device for data transmission and an optical communication device for data reception are connected individually to the corresponding processor 310, thereby achieving a reduction in cost.

(1-3-2. Modification of Forming Processor and Drive Circuit on the Same Substrate)

In the first embodiment described above, the processor 310 and the drive circuit 120 for driving the optical device are formed individually on the respective substrates. However, the first embodiment is not limited to this example, and the processor 310 and the drive circuit 120 for driving the optical device may be formed on the same substrate.

Figure 6:
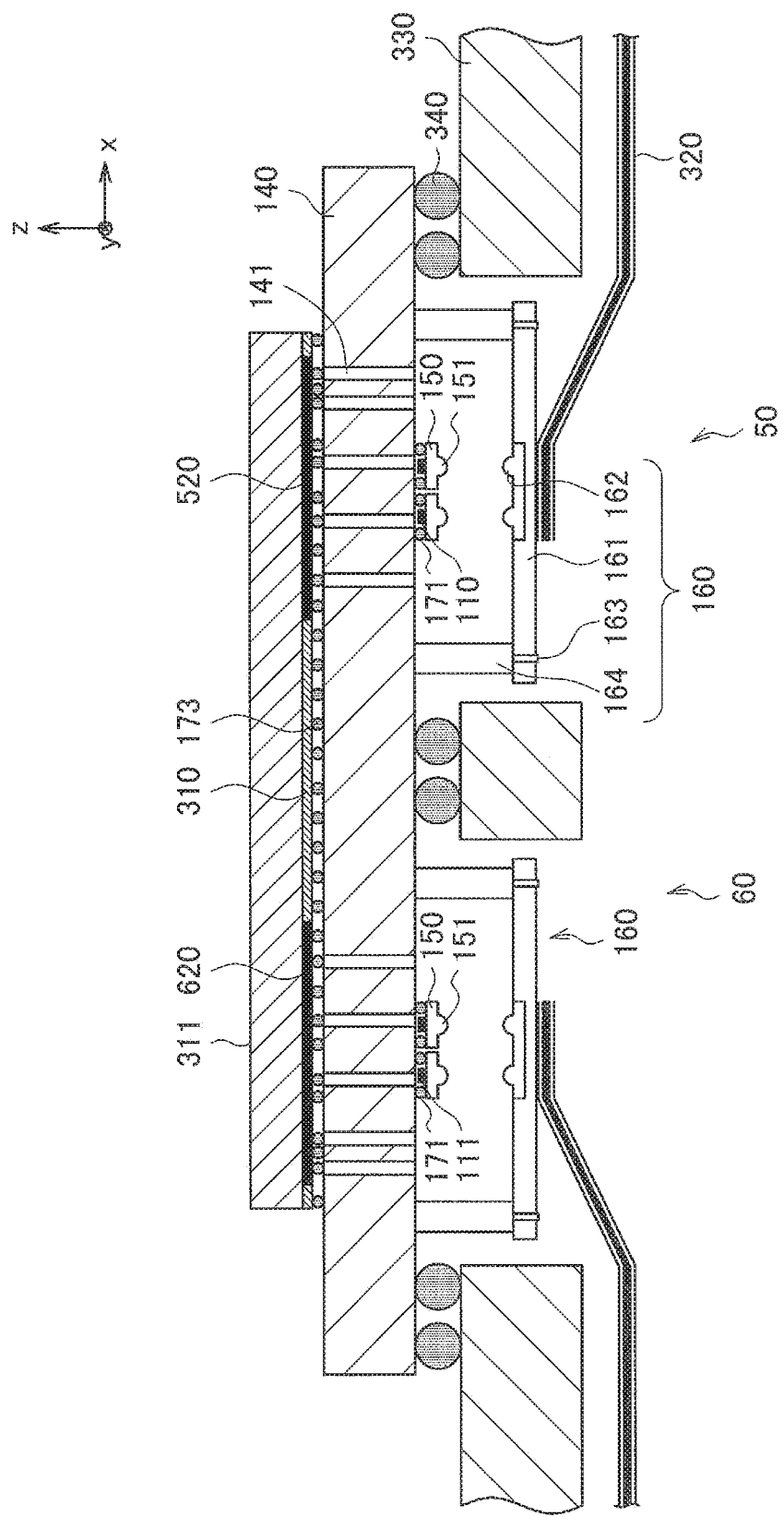
FIG. 6 is a sectional view illustrating schematically the configuration in which an optical communication device according to the modification where a processor and a drive circuit are formed on the same substrate is connected to the processor.

A modification of the first embodiment will be described with reference to FIG. 6. In the modification, a processor and a drive circuit are formed on the same substrate. FIG. 6 is a sectional view illustrating schematically the configuration in which an optical communication device according to the modification where a processor and a drive circuit are formed on the same substrate is connected to the processor.

Referring to FIG. 6, in the configuration according to the present modification, a printed substrate 330, an interposer substrate 140, and a signal processing substrate 311 are stacked on one another in this order. The signal processing substrate 311 includes a processor 310 formed thereon. The printed substrate 330 and the interposer substrate 140 are electrically connected to each other, for example, by a solder bump 340 through a pad on the printed substrate 330 and a pad on the interposer substrate 140. In addition, the interposer substrate 140 and the signal processing substrate 311 are electrically connected to each other, for example, by a solder bump 173 through a pad on the interposer substrate 140 and a pad on the signal processing substrate 311.

Optical communication devices 50 and 60 are configured by forming an opening portion in a partial region of the printed substrate 330 and providing light receiving elements 110*a* and 110*b* and light emitting elements 111*a* and 111*b*, which are optical devices, in the interposer substrate 140 at the position corresponding to the opening portion. One of the optical communication devices 50 and 60 shown in FIG. 6 is the optical communication device 50 on the receiving side and the other is the optical communication device 60 on the transmitting side. The optical communication devices 50 and 60 are connected to optical communication devices 50 and 60, which are connected to another processor 310 (not shown), for example, through a light guide member 320 on the rear surface of the printed substrate 330.

In the present modification, the receiving-side optical communication device 50 and the transmitting-side optical communication device 60 are different from each other only in types of an optical device (that is, either light receiving element or light emitting element) and in configuration of a drive circuit for driving the optical device, but other configurations are similar. Thus, the configuration of the optical communication devices 50 and 60 according to the present modification will be described based on the configuration of the receiving-side optical communication device 50 shown in FIG. 6.

Referring to FIG. 6, the optical communication device 50 according to the present modification includes the interposer substrate 140 and a drive circuit 520. The interposer substrate 140 is provided with the light receiving element 110 that is an optical device formed on a first surface side of the interposer substrate 140. The drive circuit 520 is provided in a region, which corresponds to the position where the light receiving element 110 is disposed, on a second surface side located on the opposite side of the first surface of the interposer substrate 140, and the drive circuit 520 is used to drive the light receiving element 110. The drive circuit 520 is a drive circuit for driving the light receiving element 110 and corresponds to the drive circuit 120 shown in FIGS. 1 and 2.

In the present modification, the drive circuit 520 and the processor 310 are both formed on the signal processing substrate 311. For example, the drive circuit 520 is formed in a region on the signal processing substrate 311 corresponding to the position where the light receiving element 110 on the interposer substrate 140 is disposed. The signal processing substrate 311 is stacked on the interposer substrate 140 in the state where the surface on which the processor 310 and the drive circuit 520 are formed faces the interposer substrate 140, and the drive circuit 520 and the interposer substrate 140 are electrically connected to each other through the solder bump 173. Furthermore, the light receiving element 110 and the drive circuit 520 are electrically connected to each other through a through via 141 formed through the interposer substrate 140.

A lens substrate 150 is provided on the first surface of the interposer substrate 140 to cover a plurality of light receiving elements 110. The lens substrate 150 includes a plurality of lenses 151 formed thereon in a two dimensional array. The plurality of lenses 151 are respectively provided in the position corresponding to the position at which the plurality of light receiving elements 110 are disposed, and light collected by the lens 151 is incident on the light receiving element 110. As shown in FIG. 6, the light receiving element 110 is disposed on the lens substrate 150 so that the light receiving element 110 is electrically connected to the lens substrate 150, for example, by a solder bump. In addition, the lens substrate 150 is electrically connected to the drive circuit 520 through the through via 141 by a solder bump 171. In this way, the light receiving element 110 is electrically connected to the drive circuit 520 through the lens substrate 150, the solder bump 171, and the through via 141.

In a similar way as for the optical communication device 60, a drive circuit 620 for driving the light emitting element 111 is formed on the signal processing substrate 311 in a region corresponding to the position at which the light receiving elements 111a and 111b are disposed on the interposer substrate 140. The drive circuit 620 and the interposer substrate 140 are electrically connected to each other by the solder bump 173, and the light emitting element 111 and the drive circuit 620 are electrically connected to each other through the through via 141 formed through the interposer substrate 140. In addition, in a similar way as for the optical communication device 50, a lens substrate 150 is provided on the first surface of the interposer substrate 140 to cover a plurality of light emitting elements 111. The lens substrate 150 includes a plurality of lenses 151 formed thereon in a two dimensional array. The light emitting element 111 is electrically connected to the drive circuit 620 through the lens substrate 150, the solder bump 171, and the through via 141.

An optical input/output unit 160 is provided to face the lens substrate 150. In the receiving-side optical communication device 50, the optical input/output unit 160 causes light propagated through the light guide member 320 to be incident on the light receiving element 110 through the lens 151 on the lens substrate 150. In addition, in the transmitting-side optical communication device 60, the optical input/output unit 160 causes light emitted from the light emitting element 111 to be outputted to the light guide member 320 through the lens 151 on the lens substrate 150. The configuration of the optical input/output unit 160 may be similar to that of the optical input/output unit 160 shown in FIGS. 1 and 2, and thus a detailed description thereof will be omitted.

In the present modification, in a similar way as for the optical communication device 10 described with reference to FIGS. 1 and 2, when one end of a positioning pin 164 is connected to the interposer substrate 140, its connection position is determined by setting a pad or the like formed on the lower surface of the interposer substrate 140 as an alignment pattern (hereinafter referred to as a first alignment pattern). The connection between the interposer substrate 140 and the positioning pin 164 uses, for example, a solder connection, and the alignment of the connection position of the positioning pin 164 relative to the interposer substrate 140 is performed in a self-aligned manner with respect to the first alignment pattern. In addition, the other end of the positioning pin 164 is fitted to a fitting part 163 formed on a lens substrate 161 of the optical input/output unit 160, and thus the fitting part 163 can be formed to be aligned with respect to the first alignment pattern.

However, in the present modification, unlike the optical communication device 10, the lens substrate 150 is connected to the interposer substrate 140 by causing the lens substrate 150 to be aligned in a self-aligned manner by the solder bump 171 with respect to the through via 141 formed on the interposer substrate 140 together with the first alignment pattern. In addition, the light receiving element 110 is connected to the lens substrate 150 by causing the light receiving element 110 to be aligned in a self-aligned manner by a solder bump with respect to the lens substrate 150.

In this way, in the present modification, the alignment in the plane of the lens substrate 150 and the lens substrate 161 may be performed together based on the first alignment pattern provided on the surface of the interposer substrate 140. Thus, the alignment between an optical axis of the lens 151 formed on the lens substrate 150 and an optical axis of the lens 162 formed on the lens substrate 161 can be achieved with high accuracy, thereby reducing the amount of displacement between these optical axes. Furthermore, in the present modification, the alignment for the connection between the positioning pin and the interposer substrate 140, the connection between the interposer substrate 140 and the lens substrate 150, and the connection between the lens substrate 150 and the light receiving element 110 can be performed in a self-aligned manner by a solder connection, thereby carrying out these alignments with ease and high accuracy. Thus, it is possible to carry out the alignment between the optical axis of the lens 151 and the optical axis of the lens 162 with higher accuracy, and the alignment of the light receiving element 110 with respect to the lenses 151 and 162 can be controlled with high accuracy.

The modification in which the processor and the drive circuit are formed on the same substrate has been described above with reference to FIG. 6. As described above, in the optical communication devices 50 and 60 according to the present modification, the light receiving element 110 is provided on one surface side of the interposer substrate 140, and the drive circuit 520 for driving the light receiving element 110 is provided on the other surface side of the interposer substrate 140. The drive circuit 520 is provided in a region corresponding to the position at which the light receiving element 110 is disposed. Then, the light receiving element 110 and the drive circuit 520 are electrically connected to each other by the through via 141 formed in the interposer substrate 140. Thus, in the present modification, the wiring length that is necessary for the connection between the drive circuit 520 and the light receiving element 110 can be substantially equal to the thickness of the interposer substrate 140 (the depth of the through via 141), and thus the wiring length can be made to be shorter. In addition, in the present modification, the drive circuit 520 and the processor 310 are formed together on the signal processing substrate 311 and they can be electrically connected to each other on the same substrate, so the wiring length can be made to be shorter. Thus, even in the optical communication devices 50 and 60 according to the present modification, like the optical communication device 10, the length of wiring through which electrical signals are transmitted and received between the processor 310 and the drive circuit 520 and between the drive circuit 520 and the light receiving element 110 during transmission of data can be made to be shorter than that of the general configuration illustrated in FIG. 4, and thus it is possible to reduce the deterioration of electrical signals. Therefore, high reliability in optical communication can be achieved.

Furthermore, the present modification has the configuration in which the drive circuit substrate 130 is not provided and the drive circuits 520 and 620 for driving the light receiving element 110 and the light emitting element 111, respectively, are formed on the signal processing substrate 311 together with the processor 310, which is different from the first embodiment described hereinabove. Accordingly, the size of the optical communication devices 50 and 60 can be reduced, and thus optical communication with a simpler configuration can be achieved. The processor 310 and the drive circuits 520 and 620 may be formed as a single chip on the signal processing substrate 311 by using a design technique called a system-on-a-chip (SoC).

As described above, the optical communication device according to the first embodiment includes a first substrate and the drive circuit. The first substrate has an optical device including at least one of light receiving and emitting elements disposed on a first surface of the first substrate. The drive circuit is provided in a region, which corresponds to the position at which the optical device is disposed, in a second surface located on the opposite side of the first surface of the first substrate and is used to drive the optical device. In addition, the optical communication device has the configuration in which the drive circuit and the optical device are electrically connected to each other through a through via formed through the first substrate. Furthermore, the signal processing substrate having a signal processing circuit formed therein is stacked on the second surface of the first substrate so that the signal processing substrate covers at least a region corresponding to the position at which the optical device is disposed. The signal processing circuit performs a predetermined process on electrical signals exchanged between the signal processing circuit and the drive circuit. The optical communication device according to the first embodiment preferably has the configuration described above, and the number of substrates to be stacked and types of the substrate in which the drive circuit or the optical device is provided are optional.

As an example, the optical device according to the first embodiment may have the configuration of the optical devices 10 and 20 shown in FIGS. 1 and 2. In the examples shown in FIGS. 1 and 2, the first substrate is the drive circuit substrate 130. In such a configuration, the light receiving element 110 is provided in the first surface (the lower side in the drawings) of the drive circuit substrate 130, the drive circuit 120 is provided in the second surface (the upper side in the drawings) located on the opposite side of the first surface of the drive circuit substrate 130, and the drive circuit 120 and the light receiving element 110 are electrically connected to each other through the through via 131 formed through the drive circuit substrate 130. In addition, the signal processing substrate 311 having the processor 310 formed thereon is stacked over the drive circuit substrate 130 through the interposer substrate 140, and the drive circuit 120 and the processor 310 are electrically connected to through the through via 141 formed through the interposer substrate 140.

Moreover, for example, the optical communication device according to the first embodiment may have the configuration of the optical communication devices 50 and 60 shown in FIG. 6. In the example shown in FIG. 6, the first substrate is the interposer substrate 140. In such a configuration, the light receiving element 110 is provided on the first surface (the lower side in the drawing) of the interposer substrate 140, the drive circuit 520 is provided on the second surface (the upper side in the drawing) located on the opposite side of the first surface of the interposer substrate 140, and the drive circuit 520 and the light receiving element 110 are electrically connected to each other through the through via 141 formed through the interposer substrate 140. In addition, the signal processing substrate 311 having the processor 310 and the drive circuit 520 formed thereon is stacked over the interposer substrate 140, and the drive circuit 520 and the processor 310 are electrically connected to each other on the same substrate.

Thus, in the optical communication device according to the first embodiment, as long as it has the configuration described above, the detailed configuration including the number and types of substrates to be stacked may be set and modified appropriately.

2. Second Embodiment

The second embodiment of the present disclosure is now described.

As described above, in order to secure higher reliability in optical communication, it is necessary to improve the quality of electrical signals exchanged between a processor and a drive circuit and between the drive circuit and an optical device. A technique of providing, for example, a capacitor for decoupling (a so-called bypass capacitor) between a power supply line (VDD) and a signal line of ground potential (GND) is known as a technique for improving the quality of electrical signals in an electric circuit. By providing a bypass capacitor, advantages including the reduction in noise components and control of voltage drop in a power supply line can be obtained, thereby improving the quality of electrical signals.

As an example, in the general configuration illustrated in FIG. 4, when a bypass capacitor is added to the processor 310, if the bypass capacitor is provided as a part of the circuitry of the processor 310, then the chip area increases. Thus, in the existing technology, a capacitor as a discrete part is mounted on the lower surface of the interposer substrate 840b (that is, the surface facing the printed substrate 330) and the processor 310 is connected to the capacitor through the interposer substrate 840b.

In this regard, it is generally preferable that the bypass capacitor is connected to a place physically close to an active element. This is because a longer length of wiring between an active element and the bypass capacitor causes impedance in the wiring to be non-negligible, resulting in deterioration in the quality of electrical signals. Accordingly, the capacitor is provided, for example, in a region located directly under the processor 310 in the lower surface of the interposer substrate 840*b*. However, when a capacitor is mounted on the lower surface of the interposer substrate 840*b* and the processor 310 is connected to the capacitor through the interposer substrate 840*b*, the length of wiring between an active element in the processor 310 and the capacitor is at least as large as the thickness of the interposer substrate 840*b*. Thus, in order to improve the quality of electrical signals further, it is necessary for the length of wiring between a capacitor and an active element in the processor 310 to be shorter. The provision of a capacitor as a part of the circuitry of the processor 310 may shorten the length of wiring, but a chip area of the processor 310 will be increased as described above.

In addition, in the general configuration illustrated in FIG. 4, it can be considered that a bypass capacitor is connected not only to the processor 310 but also to the drive circuit 820. However, a component such as the light receiving element 810 and/or the light emitting element or the lens substrate 850 is provided in the region located directly under the drive circuit 820 in the lower surface of the interposer substrate 840*b*. Thus, like the processor 310, it is difficult to mount a capacitor on the lower surface of the interposer substrate 840*b* and to connect the drive circuit 820 with the capacitor through the interposer substrate 840*b*. Accordingly, in the existing technique, in order to connect a bypass capacitor to the drive circuit 820, it is necessary to provide the capacitor as a part of the drive circuit 820, which leads to an increase in chip area of the drive circuit 820.

In view of the above circumstances, it has been necessary to provide a technique of improving the quality of electrical signals in a drive circuit and a processor without increasing the chip area of the drive circuit for an optical device and the processor. According to the second embodiment of the present disclosure, there is provided a technology capable of improving the quality of electrical signals without increasing the size of the overall configuration, thereby achieving higher reliability in optical communication. The second embodiment of the present disclosure is now described in detail.

[2-1. Configuration of Optical Communication Device]

Figure 7:
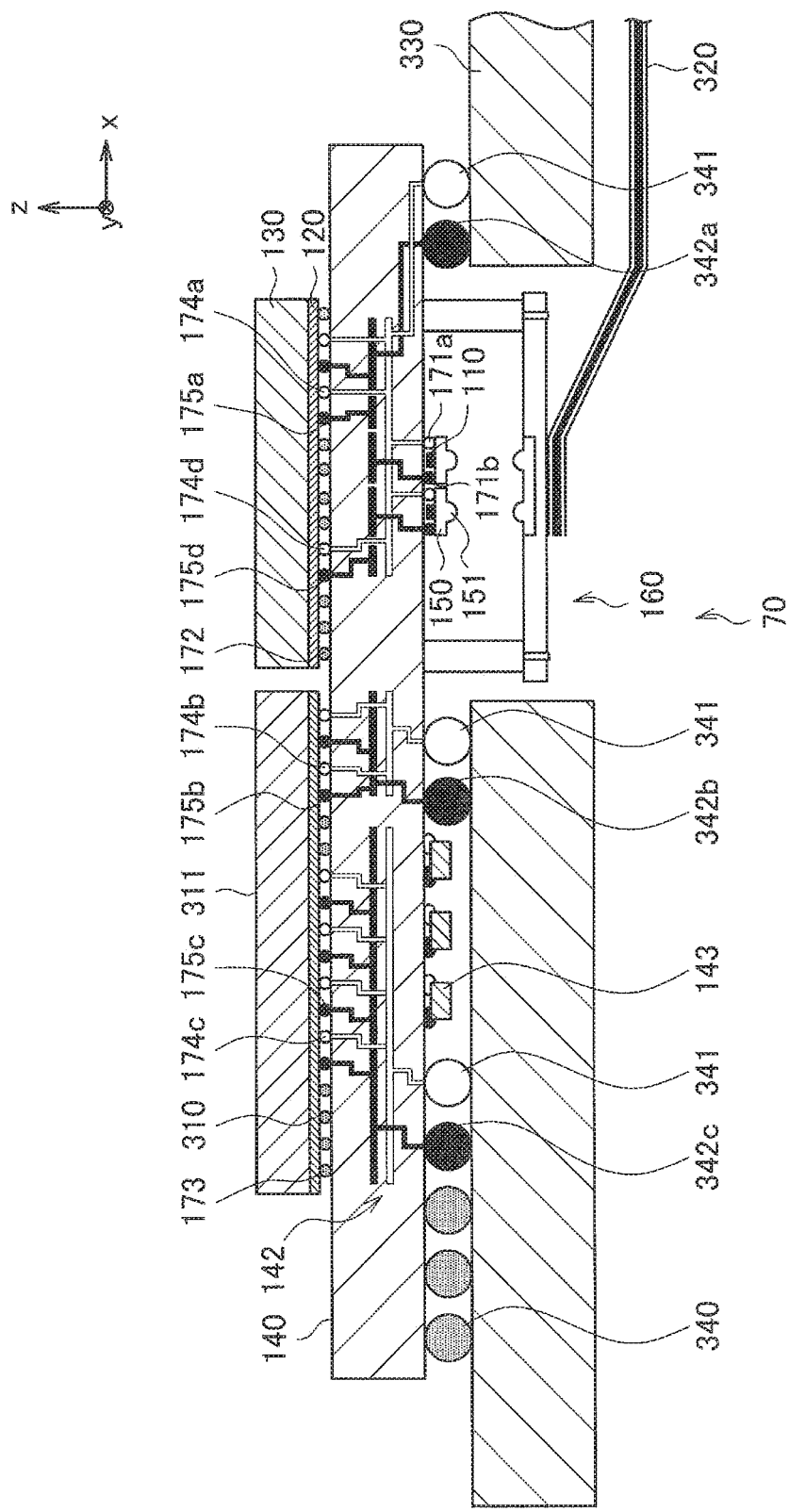
FIG. 7 is a sectional view illustrating schematically the configuration in which an optical communication device according to a second embodiment of the present disclosure is connected to a processor that transmits and receives various types of information through the optical communication device.

The configuration of an optical communication device according to the second embodiment of the present disclosure is now described with reference to FIG. 7. FIG. 7 is a sectional view illustrating schematically the configuration in which an optical communication device according to the second embodiment of the present disclosure is connected to a processor that transmits and receives various information through the optical communication device. FIG. 7 illustrates the configuration of a receiving-side optical communication device as an example of the optical communication device according to the second embodiment. The configuration of a transmitting-side optical communication device according to the second embodiment and the configuration of the receiving-side optical communication device according to the second embodiment are different from each other only in types of an optical device (that is, either light receiving element or light emitting element) and in configuration of a drive circuit for driving the optical device, but other configurations are similar. Thus, the configuration of the optical communication device according to the second embodiment will be described based on the configuration of the receiving-side optical communication device shown in FIG. 7.

Referring to FIG. 7, in the configuration according to the second embodiment, a printed substrate 330, an interposer substrate 140, and a signal processing substrate 311 are stacked on one another in this order. The signal processing substrate 311 includes a processor 310 formed thereon. In addition, a drive circuit substrate 130, which has a drive circuit 120 for driving a light receiving element 110 formed thereon, is mounted on the upper surface of the interposer substrate 140 together with the signal processing substrate 311. The printed substrate 330 and the interposer substrate 140 are electrically connected to each other, for example, by a solder bump 340 through a pad on the printed substrate 330 and a pad on the interposer substrate 140. Furthermore, the interposer substrate 140 and the signal processing substrate 311 are electrically connected to each other, for example, by a solder bump 173 through a pad on the interposer substrate 140 and a pad on the signal processing substrate 311. In addition, the interposer substrate 140 and the drive circuit substrate 130 are electrically connected to each other, for example, by a solder bump 172 through a pad on the interposer substrate 140 and a pad on the drive circuit substrate 130.

An optical communication device 70 according to the second embodiment is configured by forming an opening portion in a partial region of the printed substrate 330 and providing a light receiving element 110, which is an optical device, in the interposer substrate 140 at the position corresponding to the opening portion. The optical communication device 70 is connected to an optical communication device, which is connected to another processor 310 (not shown), for example, through a light guide member 320 in the rear surface of the printed substrate 330.

The configuration of the optical communication device 70 is now described in detail. Referring to FIG. 7, the optical communication device 70 according to the second embodiment includes the interposer substrate 140 and the drive circuit 120. The interposer substrate 140 is provided with the light receiving element 110, which is an optical device, formed on the first surface side of the interposer substrate 140. The drive circuit 120 is provided in a region, which corresponds to the position where the light receiving element 110 is disposed, on a second surface side located on the opposite side of the first surface of the interposer substrate 140, and the drive circuit 120 is used to drive the light receiving element 110. Specifically, the drive circuit substrate 130 is stacked on the upper surface of the interposer substrate 140 in the state where the surface on which the drive circuit 120 is formed faces the upper surface of the interposer substrate 140. The drive circuit 120 and the interposer substrate 140 are electrically connected to each other by the solder bump 172. In addition, the light receiving element 110 and the drive circuit 120 are electrically connected to each other through a through via (not shown) formed through the interposer substrate 140.

The light receiving element 110, the drive circuit 120, a lens substrate 150 provided to cover the light receiving element 110, a plurality of lenses 151 formed on the lens substrate 150, and an optical input/output unit 160 provided to face the lens substrate 150, which are components of the optical communication device 70, are similar in configuration to those of the first embodiment, and thus a detailed description thereof will be omitted.

The signal processing substrate 311 having the processor 310 formed thereon is disposed in a region where the drive circuit substrate 130 is not disposed on the upper surface of the interposer substrate 140. The signal processing substrate 311 is stacked on the upper surface of the interposer substrate 140 in the state where the surface on which the processor 310 is formed faces the interposer substrate 140, and the processor 310 and the interposer substrate 140 are electrically connected to each other by the solder bump 173. Thus, in the second embodiment, the processor 310 and the drive circuit 120 are electrically connected to each other through the interposer substrate 140.

Furthermore, a capacitor 143, which functions as a bypass capacitor, is mounted on a corresponding region directly under the processor 310 in the lower surface of the interposer substrate 140. The processor 310 and the capacitor 143 can be electrically connected to each other through a through via (not shown) formed through the interposer substrate 140. The capacitor is connected, for example, between VDD and GND in the processor 310. The connection of the capacitor 143 as a bypass capacitor to the processor 310 obtains advantages of suppressing deterioration in the quality of electrical signals in the processor 310.

In the second embodiment, a thin film capacitor 142 is formed in the interposer substrate 140. The thin film capacitor 142 can be formed by stacking metal thin films at predetermined intervals when the interposer substrate 140 is fabricated by stacking a plurality of layers. In FIG. 7, a through via that is formed through the interposer substrate 140 is omitted to illustrate more clearly the configuration of the thin film capacitor 142. In practice, the interposer substrate 140 is appropriately provided with a through via so that the processor 310 is electrically connected to the capacitor 143 and the printed substrate 330 or the drive circuit 120 is electrically connected to the light receiving element 110 and the printed substrate 330.

In FIG. 7, for description, a metal thin film that corresponds to the GND potential of metal thin films (electrodes) constituting the thin film capacitor 142 is indicated by white color and a metal thin film that corresponds to the VDD potential thereof is indicated by black color. In addition, the solder bumps 172, 173, and 340, which are connected to the thin film capacitor 142, are also colored with white or black color conveniently depending on the electric potential of the electrode of the thin film capacitor 142 to be connected. In the following description, solder bumps 171a, 171b, 174a, 174b, 174c, 174d, 175a, 175b, 175c, 175d, 341, 342a, 342b, and 342c are assigned with each different reference characters with respect to the solder bumps 171, 172, 173, and 340 depending on the respective electric potentials for the sake of convenience, and they have the similar function to the solder bumps 171, 172, 173, and 340 with regard to the function related to the connection between substrates.

As an example, in the second embodiment, the VDD and GND of the drive circuit 120 are connected to the respective corresponding electrodes of the thin film capacitor 142, and are respectively connected to the VDD and GND of the interposer substrate 140 through the thin film capacitor 142. Such connections are illustrated schematically in FIG. 7 as the connection between the thin film capacitor 142 and the solder bumps 341, 175a, 342a, 174a, 175a, and 342a. The solder bump 341 indicates that it is the GND potential of the interposer substrate 140, the solder bumps 175a and 342a indicate that they are the VDD potential of the interposer substrate 140, the solder bump 174a indicates that it is the GND potential of the drive circuit 120, and the solder bumps 175a and 342a indicate that they are the VDD potential of the drive circuit 120.

The VDD and GND of the drive circuit 120, when they are connected to the thin film capacitor 142, may be connected through a resistor with a predetermined resistance value. Such a resistor may be formed in the drive circuit 120 and may be formed in the interposer substrate 140. The connection of the VDD and GND of the drive circuit 120 to the thin film capacitor 142 through a resistor with a predetermined resistance value can reduce instability of impedance due to resonance and anti-resonance in the drive circuit 120. The improvement of the impedance characteristic by providing a resistor will be described later with reference to FIGS. 12A and 12B.

Moreover, for example, in the second embodiment, the anode and cathode of the light receiving element 110 are connected to the respective corresponding electrodes of the thin film capacitor 142. The cathode is further connected to the GND of the interposer substrate 140 through the thin film capacitor 142. Such connections are illustrated schematically in FIG. 7 as the connection between the thin film capacitor 142 and the solder bumps 171a, 171b, and 341. The solder bump 171a indicates that it is connected to the cathode of the light receiving element 110, the solder bump 171b indicates that it is connected to the anode of the light receiving element 110, and the solder bump 341 indicates that it is the GND potential of the interposer substrate 140. In the transmitting-side optical communication device according to the second embodiment, the anode and cathode of a light emitting element can be similarly connected to the respective corresponding electrodes of the thin film capacitor 142.

Furthermore, for example, in the second embodiment, predetermined terminals of the drive circuit 120 are connected to the respective corresponding electrodes of the thin film capacitor 142. One terminal of the predetermined terminals of the drive circuit 120 is connected to the GND of the interposer substrate 140 through the thin film capacitor 142. Such a connection is illustrated schematically in FIG. 7 as the connection between the thin film capacitor 142 and the solder bumps 174d, 175d, and 341. The solder bumps 174d and 175d indicate that they are connected to the predetermined terminal of the drive circuit 120, and the solder bump 341 indicates that it is the GND potential of the interposer substrate 140.

Moreover, for example, in the second embodiment, VDD and GND of a core circuit of the processor 310 can be connected to the respective corresponding electrodes of the thin film capacitor 142, and can be respectively connected to the VDD and GND of the interposer substrate 140 through the thin film capacitor 142. Such a connection is illustrated schematically in FIG. 7 as the connection between the thin film capacitor 142 and the solder bumps 341, 175c, 342a, 174c, 175c, and 342c. The solder bump 341 indicates that it is the GND potential of the interposer substrate 140, the solder bumps 175c and 342a indicate that they are the VDD potential of the interposer substrate 140, the solder bump 174c indicates that it is the GND potential of a core circuit of the processor 310, and the solder bumps 175c and 342c indicate that they are VDD potential of a core circuit of the processor 310.

Furthermore, for example, in the second embodiment, VDD and GND of an I/O part of the processor 310 can be connected to the respective corresponding electrodes of the thin film capacitor 142, and they can be respectively connected to the VDD and GND of the interposer substrate 140 through the thin film capacitor 142. Such a connection is illustrated schematically in FIG. 7 as the connection between the thin film capacitor 142 and the solder bumps 341, 175b, 342b, 174b, 175b, and 342b. The solder bump 341 indicates that it is the GND potential of the interposer substrate 140, the solder bumps 175b and 342b indicate that they are the VDD potential of the interposer substrate 140, the solder bump 174b indicates that it is the GND potential of the I/O part of the processor 310, and the solder bumps 175b and 342b indicate that they are VDD potential of the I/O part of the processor 310.

In this way, in the second embodiment, the thin film capacitor 142 is provided in the interposer substrate 140 and the thin film capacitor 142 is appropriately connected to the processor 310 and the drive circuit 120, so the thin film capacitor 142 functions as a bypass capacitor in the processor 310 and the drive circuit 120. Thus, even when the data is transmitted at a further higher speed in the case where data transmission between the processors 310 is performed using light, it is possible to improve the quality of electrical signals in the processor 310 and drive circuit 120, thereby achieving higher reliability in optical communication. In addition, in the second embodiment, the thin film capacitor 142 is provided inside the interposer substrate 140, and thus its chip area can be reduced as compared with the case of forming a capacitor in a circuit of the processor 310 and the drive circuit 120, so an increase in the size of the overall structure in which the processor 310 and the optical communication device 70 are connected can be controlled. Furthermore, the thin film capacitor 142 is provided inside the interposer substrate 140 and thus the distance from the thin film capacitor 142 to the processor 310 and the drive circuit 120 (that is, a wiring length) is reduced as compared with the case of mounting a capacitor on the lower surface of the interposer substrate 140. Accordingly, in the second embodiment, the quality of electrical signals can be improved without increasing the size of the overall configuration, thereby achieving higher reliability in optical communication.

The specific connection position and capacity of the thin film capacitor 142 may be designed appropriately to exhibit a desired function as a bypass capacitor depending on the circuit configuration or the like of the drive circuit 120.

[2-2. Comparison with General Optical Communication Device]

In order to make the second embodiment of the present disclosure more specific, a comparison between the optical communication device 70 according to the second embodiment and the general optical communication device 80 is now performed. The general optical communication device 80 has the configuration, for example, shown in FIG. 4 and described in the above item [1-2. Comparison with general optical communication device].

As described above, in a general technique in related art, when a bypass capacitor is connected to the drive circuit 820, it is necessary to provide the capacitor as a part of the drive circuit 820, which causes an increase in chip area. On the other hand, in the second embodiment, the thin film capacitor 142 provided inside the interposer substrate 140 is used as a bypass capacitor, and thus the increase in chip area can be controlled. The general drive circuit 820 and the drive circuit 120 according to the second embodiment are now compared to each other with respect to their circuit configuration with reference to the circuit diagrams of the drive circuits 120 and 820.

Figure 8:
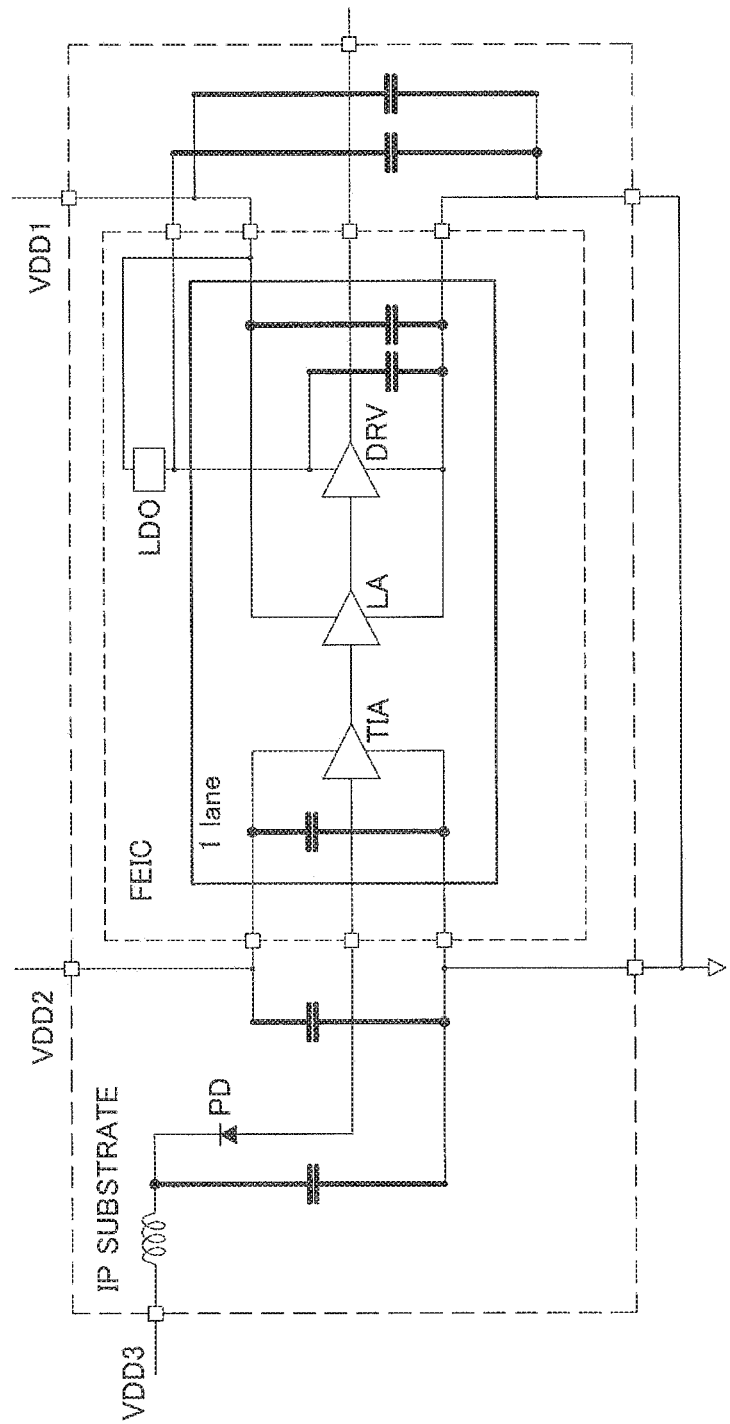
FIG. 8 is a circuit diagram illustrating an exemplary circuit configuration of a drive circuit for driving a light receiving element in a general receiving-side optical communication device.
Figure 9:
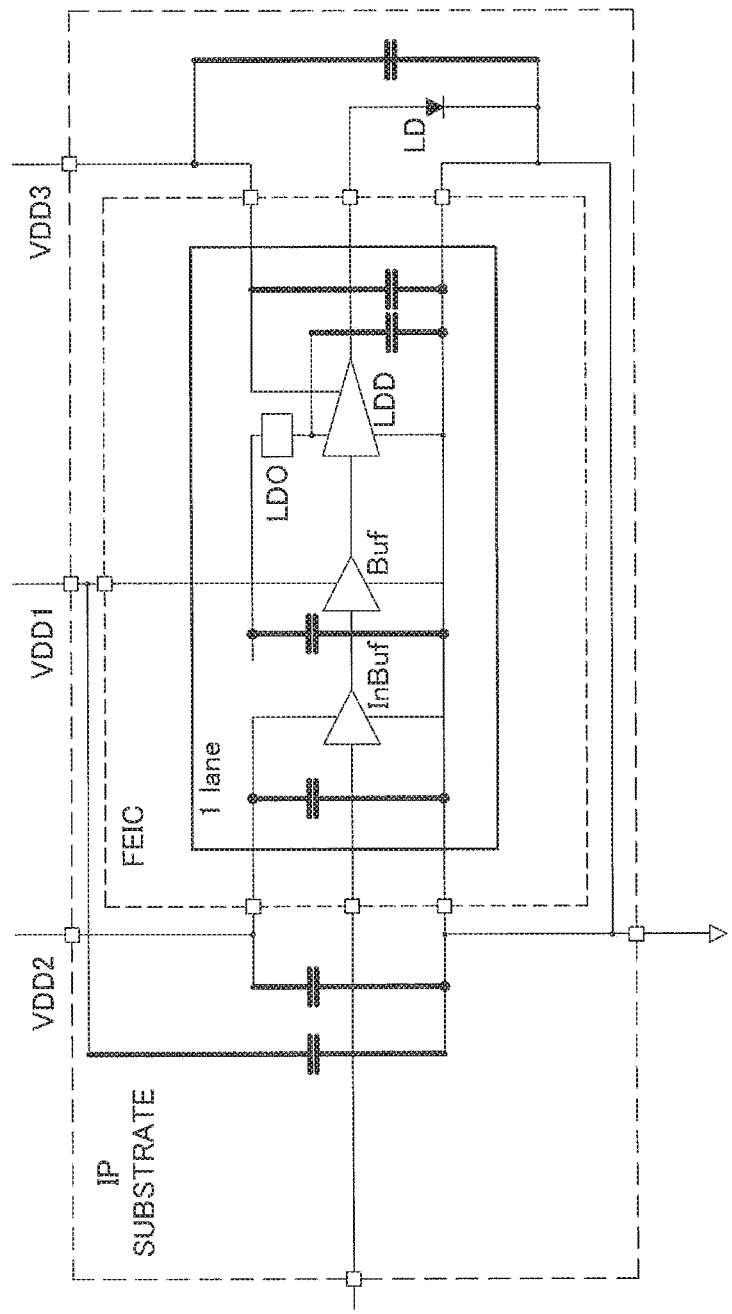
FIG. 9 is a circuit diagram illustrating an exemplary circuit configuration of a drive circuit for driving a light emitting element in a general transmitting-side optical communication device.

The circuit configuration of the general drive circuit 820 will be first described with reference to FIGS. 8 and 9. FIG. 8 is a circuit diagram illustrating an exemplary circuit configuration of a drive circuit for driving a light receiving element in a general receiving-side optical communication device. FIG. 9 is a circuit diagram illustrating an exemplary circuit configuration of a drive circuit for driving a light emitting element in a general transmitting-side optical communication device.

In FIGS. 8 and 9, the circuit configuration of a FEIC (corresponding to the drive circuit 820 in FIG. 4) on an IP substrate (corresponding to the drive circuit substrate 830 in FIG. 4) is illustrated. In addition, in FIGS. 8 and 9, for description, a circuit symbol that indicates a capacitor corresponding to a bypass capacitor and a signal line used to connect the capacitor are shown with a thick line. Referring to FIGS. 8 and 9, in a drive circuit for a general light receiving element and a drive circuit for a general light emitting element, a plurality of capacitors for a bypass capacitor are provided on the IP substrate and in the FEIC. In this way, in the configuration of the general drive circuit, the plurality of capacitors for a bypass capacitor are provided in the drive circuit, which leads to an increase in chip area.

Figure 10:
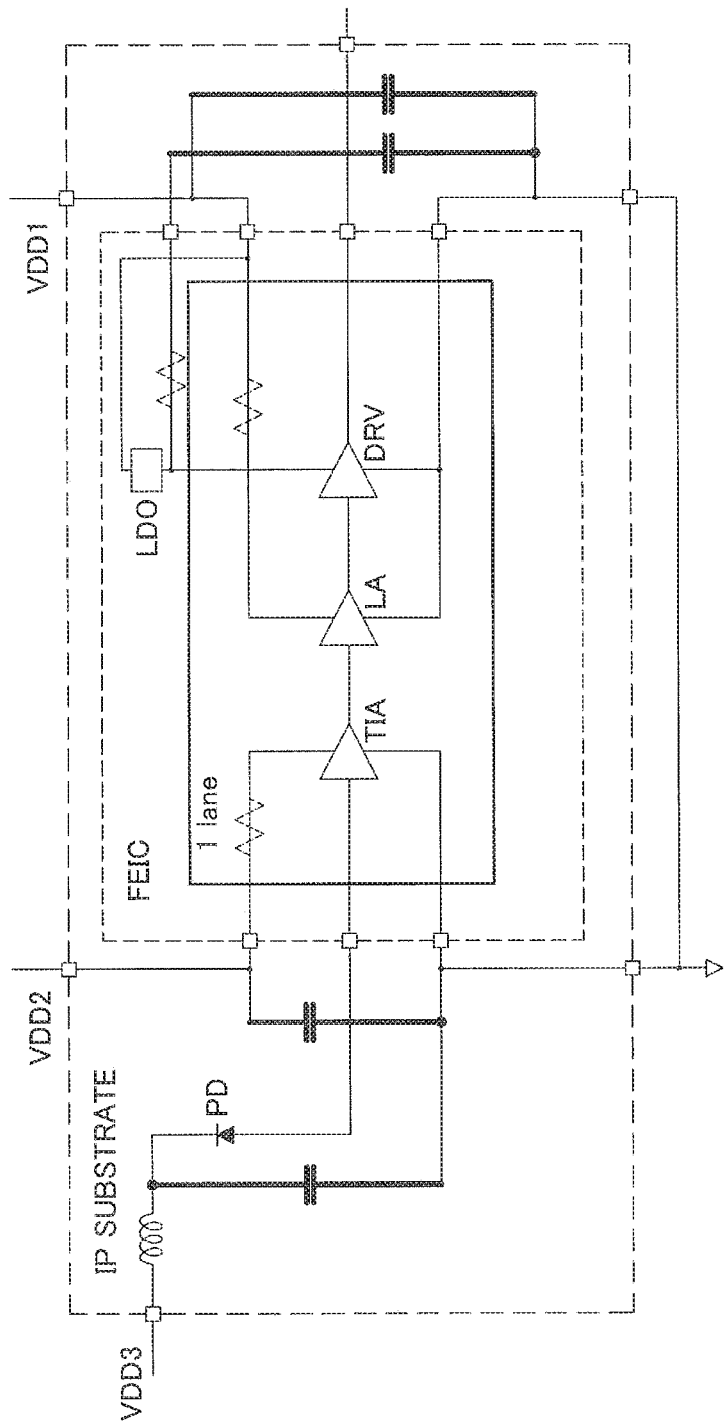
FIG. 10 is a circuit diagram illustrating an exemplary circuit configuration of a drive circuit for driving a light receiving element in a receiving-side optical communication device according to the second embodiment.
Figure 11:
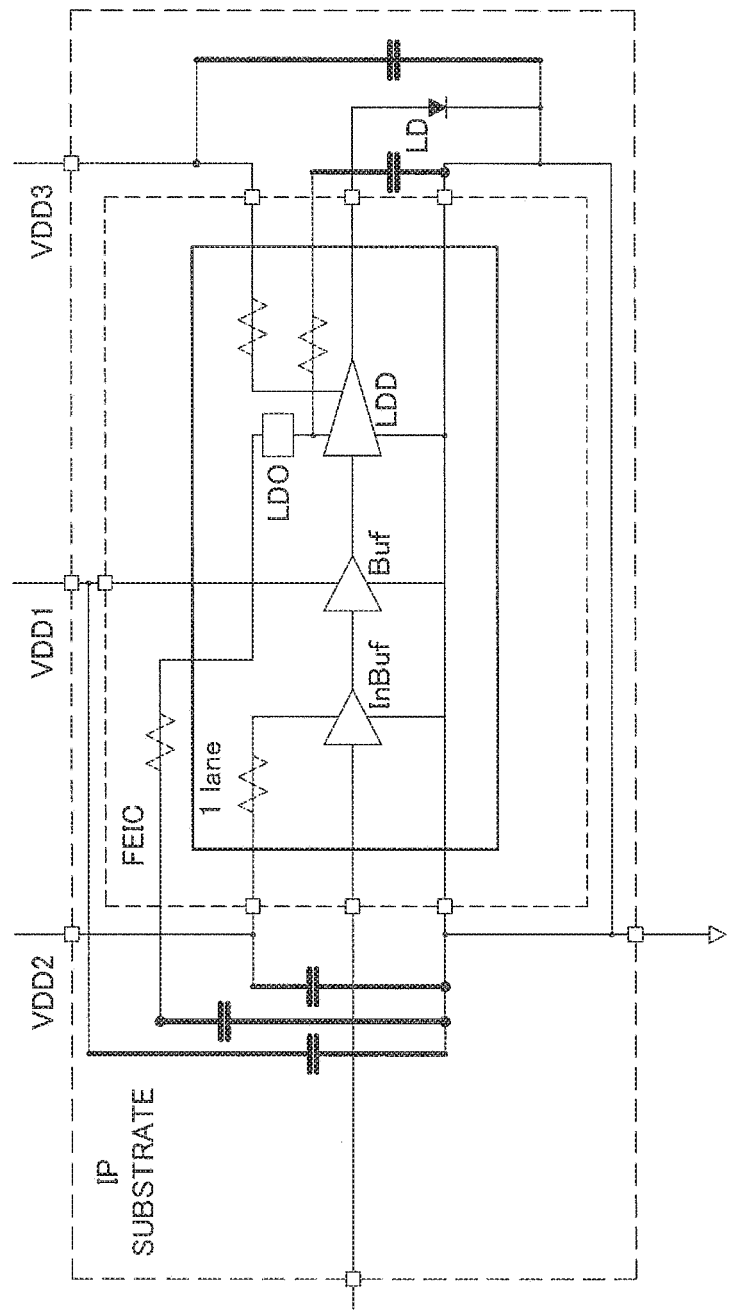
FIG. 11 is a circuit diagram illustrating an exemplary circuit configuration of a drive circuit for driving a light emitting element in a transmitting-side optical communication device according to the second embodiment.

The circuit configuration of the drive circuit 120 according to the second embodiment is now described with reference to FIGS. 10 and 11. FIG. 10 is a circuit diagram illustrating an exemplary circuit configuration of a drive circuit for driving a light receiving element in the receiving-side optical communication device according to the second embodiment. FIG. 11 is a circuit diagram illustrating an exemplary circuit configuration of a drive circuit for driving a light emitting element in the transmitting-side optical communication device according to the second embodiment.

In FIGS. 10 and 11, similarly to FIGS. 8 and 9, the circuit configuration of a FEIC (corresponding to the drive circuit 120 in FIG. 7) on an IP substrate (corresponding to the drive circuit substrate 130 in FIG. 7) is illustrated. In addition, in FIGS. 10 and 11, for description, a circuit symbol that indicates a capacitor corresponding to a bypass capacitor and a signal line used to connect the capacitor are shown with a thick line. As described above, in the second embodiment, a capacitor that functions as a bypass capacitor of the drive circuit 120 can be provided, as the thin film capacitor 142, in the interposer substrate 140 that is not presented in the circuit diagrams shown in FIGS. 10 and 11. Thus, as shown in FIGS. 10 and 11, for the drive circuits for driving the light receiving element and the light emitting element according to the second embodiment, no capacitor for a bypass capacitor may be provided in the FEIC. Therefore, the second embodiment eliminates the necessity to provide a capacitor for a bypass capacitor in the drive circuit 120, and thus an area for forming a capacitor can be reduced, thereby reducing chip area.

As described above, in the second embodiment, when the drive circuit 120 is connected to the thin film capacitor 142, the drive circuit 120 may be connected to the thin film capacitor 142 through a resistor with a predetermined resistance value. In addition, such a resistor may be formed in the drive circuit 120. In FIGS. 10 and 11, an example of a resistor that can be provided in the drive circuit 120 is illustrated with a dashed line. In this way, the connection of VDD and GND of the drive circuit 120 to the thin film capacitor 142 through a resistor with a predetermined resistance value can control fluctuation in impedance due to resonance and anti-resonance in the drive circuit 120.

Figure 12A:
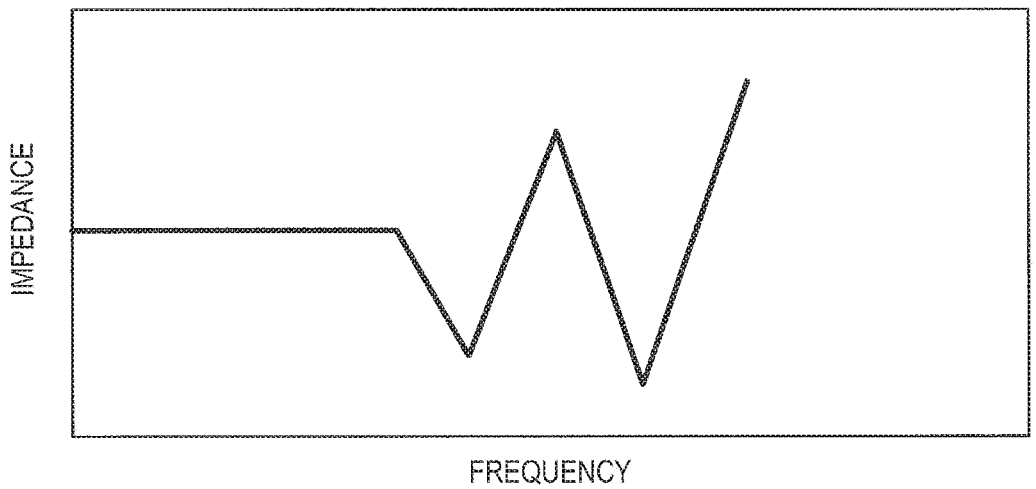
FIG. 12A is a diagram for describing advantages of controlling a impedance fluctuation by providing a resistor in a signal line.
Figure 12B:
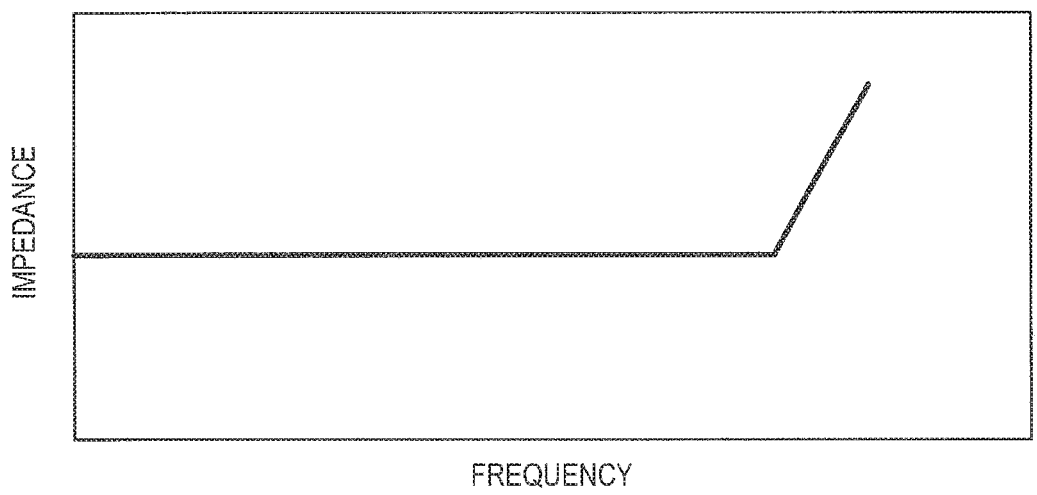
FIG. 12B is a diagram for describing advantages of controlling a impedance fluctuation by providing a resistor in a signal line.

Referring to FIGS. 12A and 12B, an advantage of controlling the impedance fluctuation by providing a resistor in a signal line is now described. FIGS. 12A and 12B are diagrams for describing the advantage of controlling the impedance fluctuation by providing a resistor to a signal line. In FIGS. 12A and 12B, the relationship between a frequency of electrical current applied to a signal line and impedance in the signal line is plotted conceptually in the graph where the horizontal axis represents the frequency and the vertical axis represents the impedance.

FIG. 12A illustrates conceptually an example of the relationship between frequency and impedance in a signal line, when no resistor is provided. As shown in FIG. 12A, when no resistor is provided, impedance will fluctuate significantly, for example, due to resonance and anti-resonance. The impedance characteristic having such significant fluctuation can cause noise of electrical signals, and thus this characteristic will be undesirable to obtain high quality electrical signals.

On the other hand, FIG. 12B illustrates conceptually an example of the relationship between frequency and impedance in a signal line, when a resistor is provided. As shown in FIG. 12B, the impedance fluctuation, for example, due to resonance and anti-resonance can be controlled by providing a resistor. In this way, in the second embodiment, when the drive circuit 120 is connected to the thin film capacitor 142, the connection is made through a resistor with a predetermined resistance value, and thus the impedance characteristic with smaller fluctuation can be obtained, thereby improving the quality of electrical signals.

A specific connection position and resistance value of a resistor to be provided may be designed appropriately to obtain desired impedance characteristic based on, for example, the circuit configuration of the drive circuit 120 and the connection position of a bypass capacitor.

The result obtained by comparison between the optical communication device 70 according to the second embodiment and the general optical communication device 80 has been described hereinbefore. As described above, in the configuration of the general drive circuit 820, a plurality of capacitors for a bypass capacitor are formed in the drive circuit 820, which leads to an increase in chip area. On the other hand, in the second embodiment, the thin film capacitor 142 provided inside the interposer substrate 140 can be used as a bypass capacitor of the drive circuit 120. Accordingly, the second embodiment eliminates the necessity to provide a capacitor for a bypass capacitor in the drive circuit 120, and thus an area for forming the capacitor can be reduced, thereby reducing chip area.

[2-3. Modification]

Modifications of the second embodiment are now described. The second embodiment may employ the following configurations.

(2-3-1. Modification of Adding Thin-Film Capacitor to the First Embodiment)

The second embodiment described above has the configuration in which the signal processing substrate 311 having the processor 310 formed on the signal processing substrate 311, and the drive circuit substrate 130 having the drive circuit 120 formed on the drive circuit substrate 130 are stacked together on the interposer substrate 140. However, the second embodiment is not limited to this example. For example, the second embodiment may have the configuration in which the drive circuit substrate 130 having the drive circuit 120 formed on the drive circuit substrate 130 is provided on the lower surface of the interposer substrate 140, the signal processing substrate 311 having the processor 310 formed thereon is provided on the upper surface of the interposer substrate 140, and the drive circuit 120 and the processor 310 are electrically connected to each other through the through via 141 formed through the interposer substrate 140. This corresponds to the configuration in which the thin film capacitor 142 provided in the interposer substrate 140 is added to the configuration according to the first embodiment shown in FIGS. 1 and 2.

Figure 13:
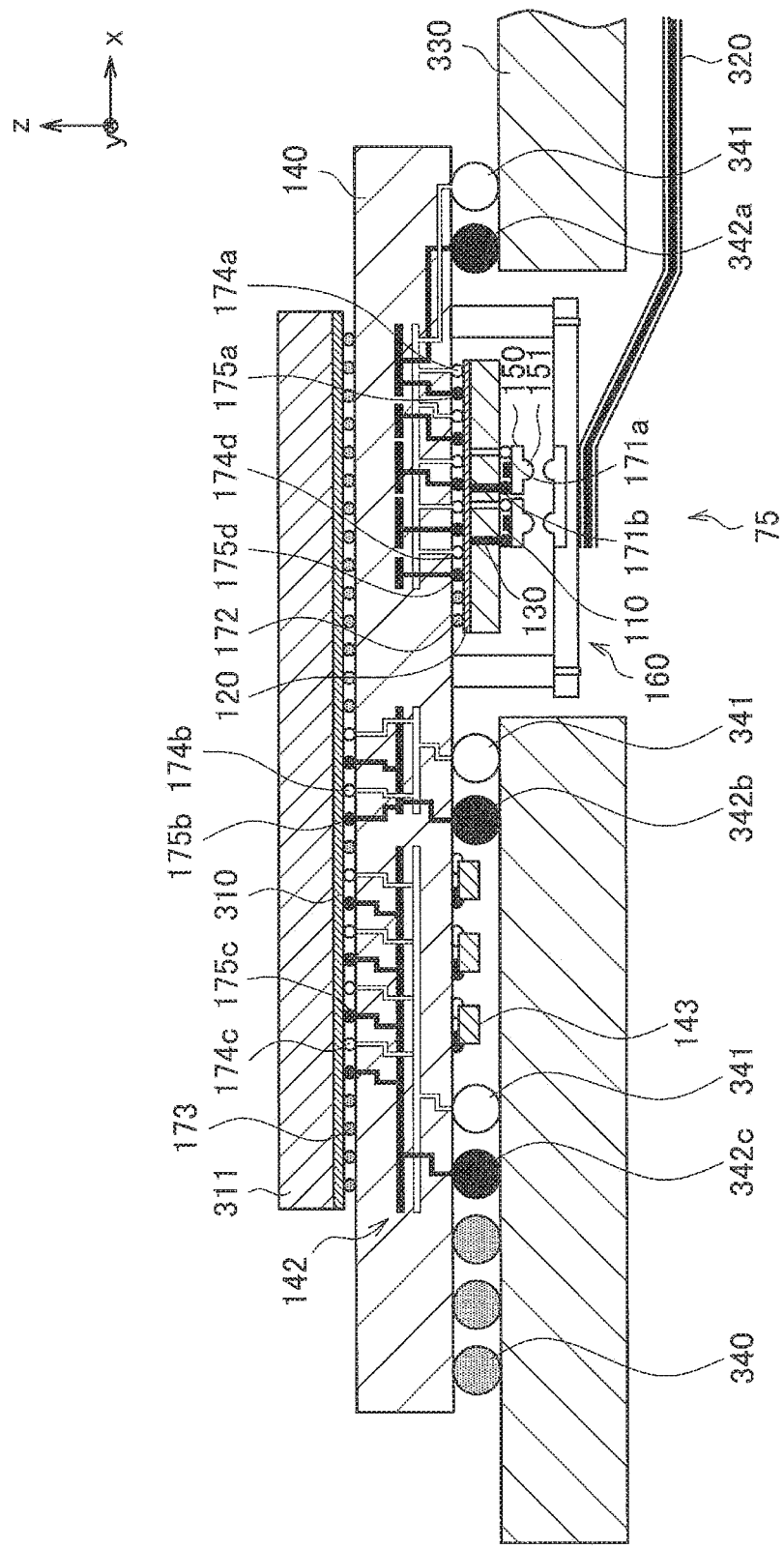
FIG. 13 is a sectional view illustrating schematically the configuration in which an optical communication device according to a modification of adding a thin film capacitor to the first embodiment is connected to a processor that transmits and receives various types of information through the optical communication device.

The modification in which a thin film capacitor is added to the first embodiment is now described with reference to FIG. 13. FIG. 13 is a sectional view illustrating schematically a configuration in which an optical communication device according to the modification in which a thin film capacitor is added to the first embodiment is connected to a processor that transmits and receives various information through the optical communication device. In FIG. 13, the configuration of a receiving-side optical communication device is illustrated as an example of the optical communication device according to the present modification. The configuration of a transmitting-side optical communication device according to the present modification and the configuration of the receiving-side optical communication device according to the present modification are different from each other only in types of an optical device (that is, either light receiving element or light emitting element) and in configuration of a drive circuit for driving the optical device, but other configurations are similar. Thus, the configuration of the optical communication device according to the present modification will be described based on the configuration of the receiving-side optical communication device shown in FIG. 13.

Referring to FIG. 13, in the configuration according to the present modification, a printed substrate 330, an interposer substrate 140, and a signal processing substrate 311 are stacked on one another in this order. The signal processing substrate 311 includes a processor 310 formed on the signal processing substrate 311. The printed substrate 330 and the interposer substrate 140 are electrically connected to each other, for example, by a solder bump 340 through a pad on the printed substrate 330 and a pad on the interposer substrate 140. In addition, the interposer substrate 140 and the signal processing substrate 311 are electrically connected to each other, for example, by a solder bump 173 through a pad on the interposer substrate 140 and a pad on the signal processing substrate 311.

An optical communication device 75 according to the present modification is configured by forming an opening portion in a partial region of the printed substrate 330 and providing a light receiving element 110, which is an optical device, in the interposer substrate 140 at the position corresponding to the opening portion. The optical communication device 75 and an optical communication device connected to another processor 310 (not shown) are connected to each other, for example, through a light guide member 320 in the rear surface of the printed substrate 330. FIG. 13 illustrates the configuration of the receiving-side optical communication device 75 as an example of the optical communication device according to the present modification. The configuration of a transmitting-side optical communication device according to the present modification and the configuration of the receiving-side optical communication device 75 according to the present modification are different from each other only in types of an optical device (that is, either light receiving element or light emitting element) and in configuration of a drive circuit for driving the optical device, but other configurations are similar. Thus, the configuration of the optical communication device according to the present modification will be described based on the configuration of the receiving-side optical communication device 75 shown in FIG. 13.

Referring to FIG. 13, the optical communication device 75 according to the present modification includes a drive circuit substrate 130 and a drive circuit 120. The drive circuit substrate 130 is provided with a light receiving element 110, which is an optical device, formed on the first surface side of the drive circuit substrate 130. The drive circuit 120 is provided in a region, which corresponds to the position at which the light receiving element 110 is disposed, in a second surface side located on the opposite side of the first surface of the drive circuit substrate 130, and the drive circuit 120 is used to drive the light receiving element 110. In addition, the drive circuit 120 and the light receiving element 110 are electrically connected to each other through a through via 131 formed through the drive circuit substrate 130.

The interposer substrate 140 is stacked on the drive circuit substrate 130 so that the interposer substrate 140 faces the drive circuit 120, and the drive circuit 120 on the drive circuit substrate 130 and the interposer substrate 140 are electrically connected to each other by a solder bump 172. In addition, the signal processing substrate 311 on which the processor 310 is formed is stacked on the interposer substrate 140 so that the signal processing substrate 311 covers at least a region corresponding to the position at which the light receiving element 110 is disposed. Specifically, the signal processing substrate 311 is stacked on the interposer substrate 140 in the state where the processor 310 faces the interposer substrate 140. The processor 310 has, for example, an I/O part that is electrically connected to the interposer substrate 140 by the solder bump 173. Furthermore, the processor 310 and the drive circuit 120 are electrically connected to each other through a through via 141 formed through the interposer substrate 140.

A lens substrate 150, which includes a plurality of lenses 151 formed thereon in a two-dimensional manner, is provided in the first surface of the interposer substrate 140 so that the lens substrate 150 covers a plurality of light receiving elements 110. The plurality of lenses 151 are provided at the respective positions corresponding to the position where the plurality of light receiving elements 110 are disposed, and light collected by the lens 151 is incident on the light receiving element 110. As shown in FIG. 13, the light receiving element 110 is disposed on the lens substrate 150 so that the light receiving element 110 is electrically connected to the lens substrate 150, for example, by using a solder bump. In addition, the lens substrate 150 is electrically connected to the drive circuit 120 through the through via 141 by a solder bump 171. In this way, the light receiving element 110 is electrically connected to the drive circuit 120 through the lens substrate 150, the solder bump 171, and the through via 131.

An optical input/output unit 160 is provided to face the lens substrate 150. In the receiving-side optical communication device 75, the optical input/output unit 160 causes light propagated through a light guide member 320 to be incident on the light receiving element 110 through the lens 151 on the lens substrate 150. In addition, in a transmitting-side optical communication device, the optical input/output unit 160 causes light emitted from a light emitting element to be outputted to the light guide member 320 through the lens 151 on the lens substrate 150.

The components of the optical communication device 75, that is, the light receiving element 110, the drive circuit 120, the lens substrate 150 provided to cover the light receiving element 110, the plurality of lenses 151 formed on the lens substrate 150, and the optical input/output unit 160 provided to face the lens substrate 150 are similar in configuration to those of the first embodiment, and thus a detailed description thereof will be omitted.

In the present modification, a bypass capacitor is connected to the processor 310 and the drive circuit 120. Specifically, a capacitor 143, which functions as a bypass capacitor, is mounted on a corresponding region directly under the processor 310 in the lower surface of the interposer substrate 140. The processor 310 and the capacitor 143 can be electrically connected to each other through a through via (not shown) formed through the interposer substrate 140. The capacitor 143 is connected, for example, between VDD and GND in the processor 310. The connection of the capacitor 143 functioning as a bypass capacitor to the processor 310 can obtain an advantage of suppressing deterioration in the quality of electrical signals in the processor 310.

Moreover, a thin film capacitor 142 is formed inside the interposer substrate 140, and the processor 310 and the drive circuit 120 are electrically connected to the thin film capacitor 142. In FIG. 13, a through via that is formed through the interposer substrate 140 is omitted to illustrate more clearly the configuration of the thin film capacitor 142. In practice, the interposer substrate 140 is appropriately provided with a through via to allow the processor 310 to be electrically connected to the capacitor 143 and the printed substrate 330 or to allow the drive circuit 120 to be electrically connected to the light receiving elements 110*a* and 110*b* and the printed substrate 330.

Even in the present modification, a signal line to which a bypass capacitor is connected in the processor 310 and the drive circuit 120 may be similar to that of the second embodiment described above, so a detailed description thereof will be omitted. Also in FIG. 13, similarly to FIG. 7, for description, a metal thin film that corresponds to the GND potential of metal thin films (electrodes) constituting the thin film capacitor 142 is indicated by white color, and a metal thin film that corresponds to the VDD potential thereof is indicated by black color. In addition, the solder bumps 171, 172, 173, and 340, which are connected to the thin film capacitor 142, are also colored with white or black color conveniently depending on the electric potential of the electrode of the thin film capacitor 142 to be connected.

As a modification of the second embodiment, the modification in which a thin film capacitor is added to the first embodiment has been described. In the present modification, the thin film capacitor 142 is formed in the interposer substrate 140 and the thin film capacitor 142 is used as a bypass capacitor of the processor 310 and the drive circuit 120, and this is different from the configuration of the first embodiment. Thus, it is possible to further improve the quality of electrical signals without increasing the size of the overall structure, in addition to the advantage of improving the quality of electrical signals that is obtainable from the first embodiment.

The modification of the second embodiment is not limited to the configuration described above and shown in FIG. 13, and other configurations may be employed. For example, as a modification of the second embodiment, a configuration in which a thin film capacitor is formed in the interposer substrate 140 and the thin film capacitor 142 is used as a bypass capacitor of the processor 310 and the drive circuit 120 can be employed, as compared with the configuration illustrated in FIG. 5 or 6.

[2-4. Mounting of Bypass Capacitor on Substrate Surface]

As described above, in the second embodiment, the capacitor 143 that functions as a bypass capacitor of the processor 310 is mounted on the lower surface of the interposer substrate 140. The position at which the capacitor 143 is arranged relative to the processor 310 in the second embodiment is now described with reference to FIGS. 14A to 14E. FIGS. 14A to 14E are diagrams for describing the position at which the capacitor 143 is arranged relative to the processor 310 in the second embodiment.

FIGS. 14A to 14E illustrate schematically a general configuration and the configuration according to the second embodiment when viewed from the above and illustrate the positional relationship between the interposer substrates 140 and 840b, the processor 310, the drive circuit 120, and the capacitor 143. In addition, in FIGS. 14A to 14E, a VDD/GND region 315, an I/O region 317, and an optical input/output region 165 are illustrated together. The VDD/GND region 315 indicates a portion where a signal line of the VDD and GND in the processor 310 is mainly arranged, the I/O region 317 indicates a region where the I/O part of the processor 310 is arranged, and the optical input/output region 165 is used to emit and receive light (for example, corresponding to the area of the optical input/output unit 160).

Figure 14A:
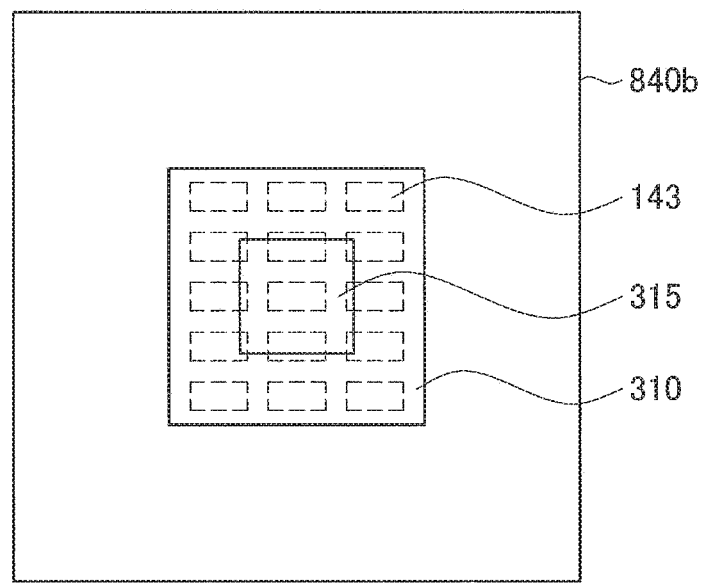
FIG. 14A is a diagram for describing a position at which a capacitor is arranged with respect to the processor according to the second embodiment.

FIG. 14A illustrates the positional relationship among the interposer substrate 840b, the processor 310, the VDD/GND region 315, and the capacitor 143, for example, when the capacitor 143 is provided in the general optical communication device 80 shown in FIG. 4. As described above with reference to FIG. 4, in the general configuration, the processor 310 and the drive circuit 820 are mounted on the separate interposer substrates 840b and 840a, respectively. Thus, as shown in FIG. 14A, the drive circuit 820 and the optical input/output region 165 are not provided in the interposer substrate 840b on which the processor 310 is mounted. Accordingly, in the general configuration, the capacitor 143 can be mounted over the entire surface of a region corresponding to the processor 310.

Figure 14B:
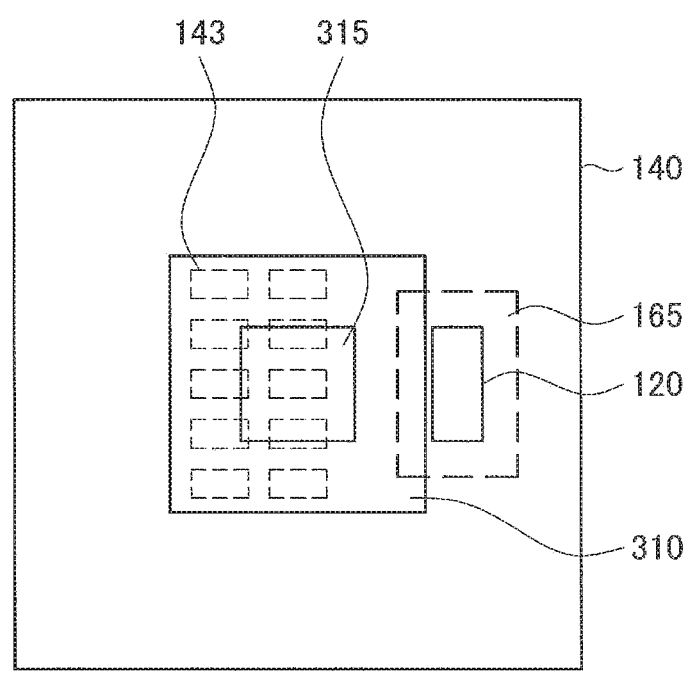
FIG. 14B is a diagram for describing a position at which a capacitor is arranged with respect to the processor according to the second embodiment.

FIG. 14B illustrates the positional relationship among the interposer substrate 140, the processor 310, the VDD/GND region 315, the drive circuit 120, the optical input/output region 165, and the capacitor 143, for example, in the optical communication device 70 according to the second embodiment shown in FIG. 7. As described above with reference to FIG. 7, in the configuration according to the second embodiment, the processor 310 and the drive circuit 120 are mounted on the same interposer substrate 140. An optical device is provided on a region corresponding to the optical input/output region 165 in the lower surface of the interposer substrate 140, and thus the capacitor 143 is not mounted in the region corresponding to the optical input/output region 165 as shown in FIG. 14B.

Figure 14C:
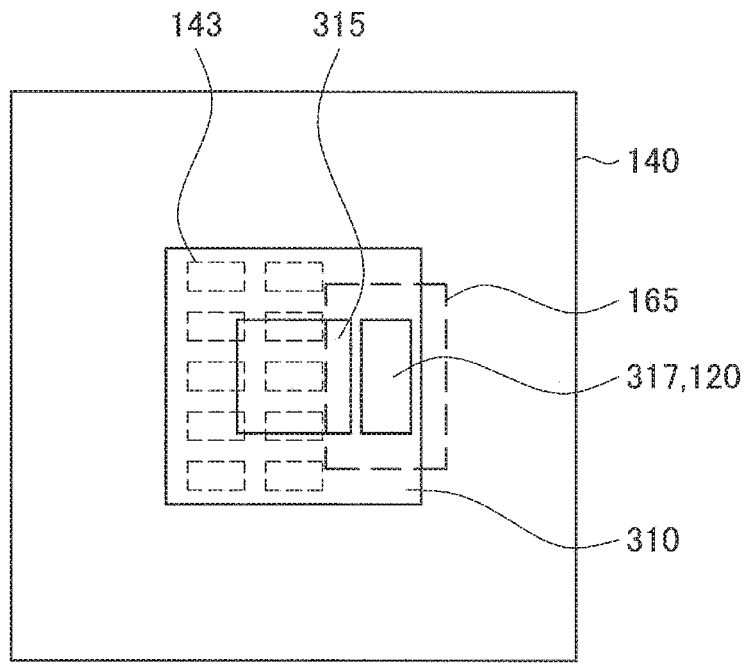
FIG. 14C is a diagram for describing a position at which a capacitor is arranged with respect to the processor according to the second embodiment.

FIG. 14C illustrates the positional relationship among the interposer substrate 140, the processor 310, the VDD/GND region 315, the I/O region 317, the drive circuit 120, the optical input/output region 165, and the capacitor 143, for example, in the optical communication device 75 according to the exemplary modification of the second embodiment shown in FIG. 13. As described above with reference to FIG. 13, in the configuration according to the modification, the drive circuit 120 and the optical input/output region 165 are located, for example, directly under the I/O part of the processor 310 in a similar way to the configuration according to the first embodiment. Thus, as shown in FIG. 14C, the capacitor 143 is not mounted in the region corresponding to the optical input/output region 165 in the lower surface of the interposer substrate 140.

Figure 14D:
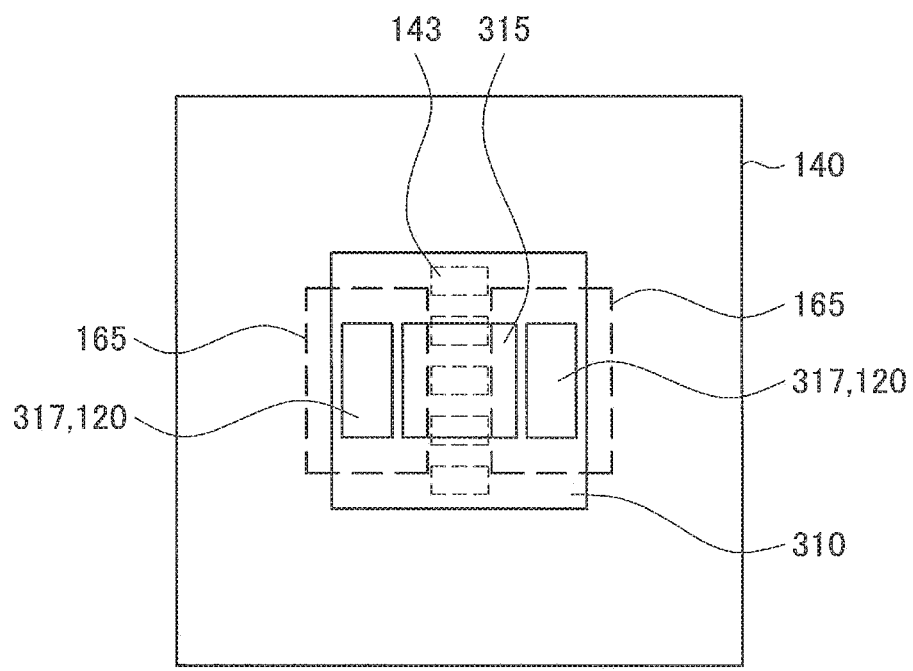
FIG. 14D is a diagram for describing a position at which a capacitor is arranged with respect to the processor according to the second embodiment.

FIG. 14D illustrates the positional relationship among the interposer substrate 140, the processor 310, the VDD/GND region 315, the I/O region 317, the drive circuit 120, the optical input/output region 165, and the capacitor 143 in the configuration in which the receiving-side optical communication devices 10 and 50 and the transmitting-side optical communication devices 20 and 60 are together provided for a single processor 310, for example, like the optical communication devices 10 and 20 according to the first embodiment shown in FIG. 1 and the optical communication devices 50 and 60 according to the modification of the first embodiment shown in FIG. 6. As described above with reference to FIGS. 1 and 6, in these configurations, the drive circuit 120 and the optical input/output region 165 are located directly under the I/O part of the processor 310. Thus, as shown in FIG. 14D, the capacitor 143 is not mounted in the region corresponding to the optical input/output region 165 in the lower surface of the interposer substrate 140. In the present modification, the optical input/output region 165 for both the receiving-side and transmitting-side optical communication devices exists in the corresponding region directly under the processor 310, and thus a region incapable of mounting the capacitor 143 in the lower surface of the interposer substrate 140 is increased, in comparison with the example shown in FIGS. 14B and 14C.

Figure 14E:
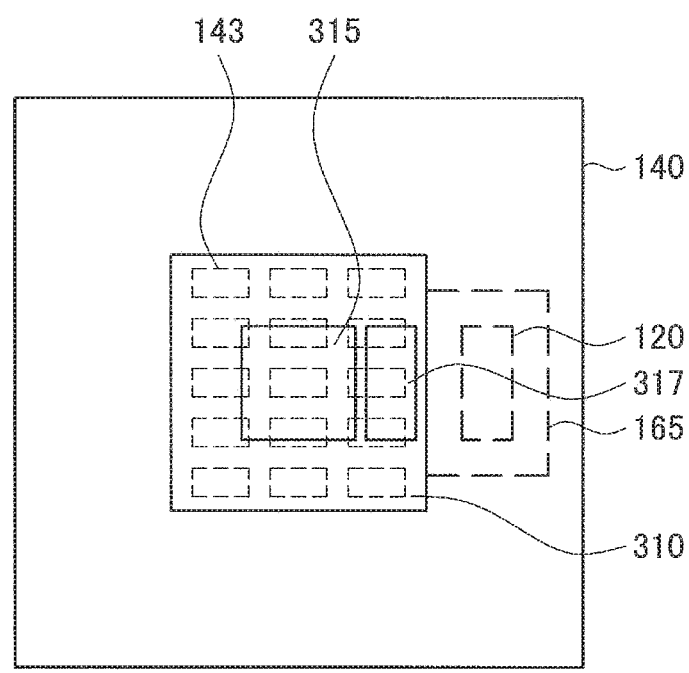
FIG. 14E is a diagram for describing a position at which a capacitor is arranged with respect to the processor according to the second embodiment.

FIG. 14E illustrates the positional relationship among the interposer substrate 140, the processor 310, the VDD/GND region 315, the I/O region 317, the drive circuit 120, the optical input/output region 165, and the capacitor 143 in the configuration in which, for example, the drive circuit 120 is disposed in a region directly under the processor 310 but the optical input/output region 165 is not provided directly under the drive circuit 120, unlike the configurations described above. In the second embodiment, the configuration shown in FIG. 14E can be employed as a modification of the second embodiment. In such a configuration, the position where the optical input/output region 165 is formed is determined appropriately so that the optical input/output region 165 is not located directly under the processor 310. Thus, as shown in FIG. 14E, the capacitor 143 can be mounted over the entire surface of a region corresponding to the processor 310 in the lower surface of the interposer substrate 140.

The position at which the capacitor 143 is arranged with respect to the processor 310 and the drive circuit 120 in the second embodiment has been described above with reference to FIGS. 14A to 14E.

3. Application Example

An application example of the optical communication device according to the first and second embodiments described above is now described.

(3-1. Optical Interconnect Between Processors on Printed Substrate)

The optical communication device according to the first and second embodiments can be suitably applied to optical interconnect between processors mounted on a printed substrate. An exemplary configuration in which the optical communication device according to the first and second embodiments is applied to optical interconnect between processors mounted on a printed substrate is now described with reference to FIG. 15. FIG. 15 is a diagram illustrating schematically an exemplary configuration in which the optical communication device according to the first and second embodiments is applied to optical interconnect between processors mounted on a printed substrate.

FIG. 15 illustrates a case where the optical communication devices 10 and 20 according to the first embodiment illustrated in FIG. 1 are applied to optical interconnect between processors 310, as an example of the present application example. Referring to FIG. 15, a plurality of structures in which a plurality of processors 310 are mounted on a printed substrate 330 through an interposer substrate 140 are provided in series. FIG. 15 corresponds to an exterior diagram illustrating the configuration in which a plurality of structures shown in FIG. 1 are arranged when viewed from above (the positive direction of the z-axis).

For each processor 310, a receiving-side opening portion and a transmitting-side opening portion are formed in a printed substrate. The receiving-side opening portion is provided with a receiving-side optical communication device 10 having a light receiving element 110 and a drive circuit 120 for driving the light receiving element 110. The transmitting-side opening portion is provided with a transmitting-side optical communication device 20 having a light emitting element and a drive circuit for driving the light emitting element. A light guide member 320 is provided between the receiving-side optical communication device 10 provided for a processor 310 and the transmitting-side optical communication device 20 for another processor 310 (more specifically, between a light input/output region 165 of the receiving-side optical communication device 10 and a light input/output region 165 of the transmitting-side optical communication device 20). The data transmission is performed through the light guide member 320 between the optical communication devices 10 and 20.

In the above, as an example of the present application example, the case where the optical communication devices 10 and 20 according to the first embodiment illustrated in FIGS. 1 and 2 are applied to optical interconnect between processors 310 has been described, but the present application example is not limited thereto. The optical communication devices according to the embodiments and modifications described above are similarly applicable to optical interconnect between the processors 310.

(3-2. Optical Communication Between Apparatus)

Figure 16:
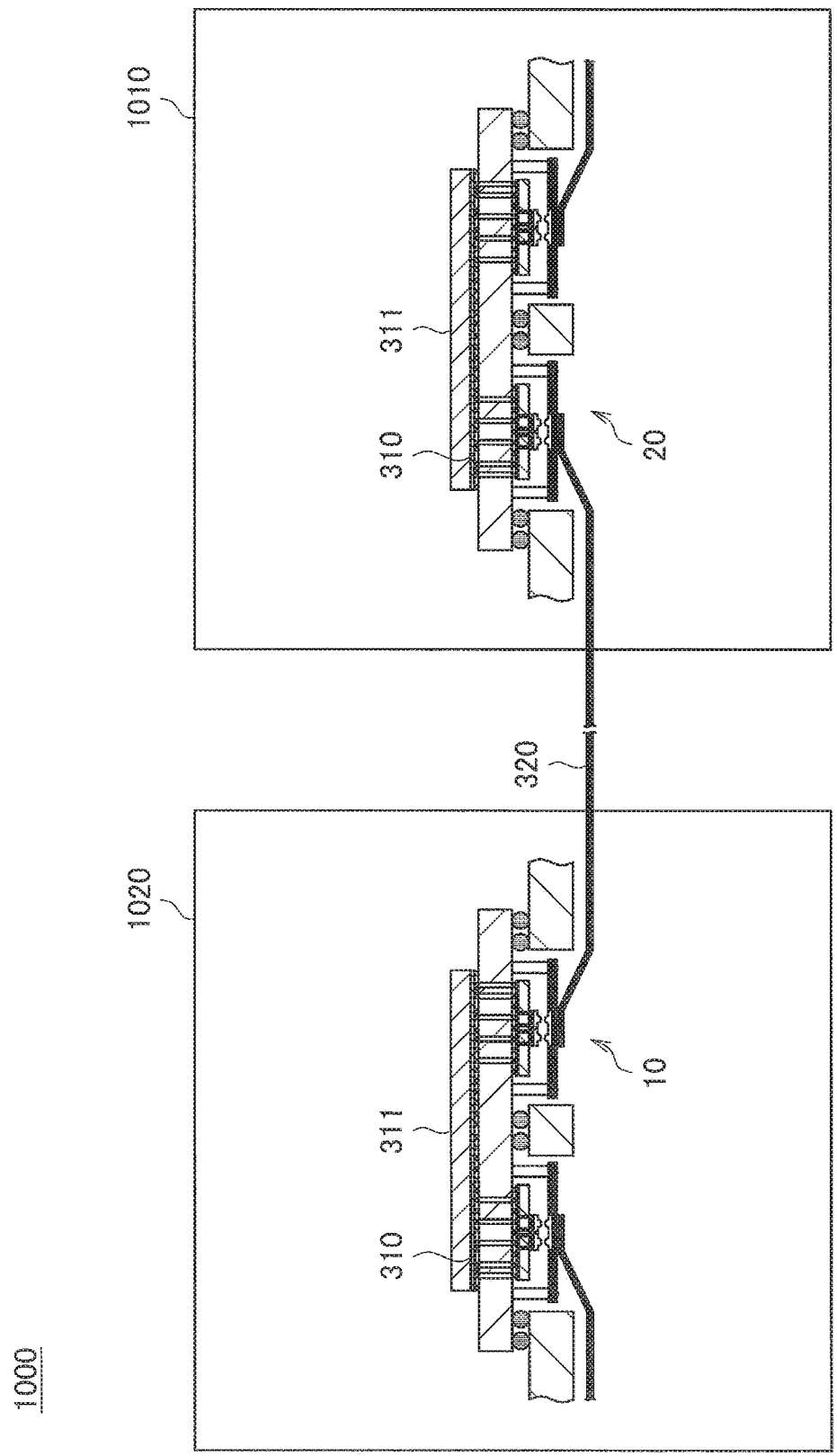
FIG. 16 is a diagram illustrating schematically an exemplary configuration when the optical communication device according to the first and second embodiments is used in optical communication between information processing apparatus.

The optical communication devices according to the first and second embodiments are suitably applicable to optical communication between information processing apparatus such as personal computers (PCs), workstations (WSs), and servers. Referring to FIG. 16, an exemplary configuration when the optical communication device according to the first and second embodiments is applied to optical communication between information processing apparatus is now described. FIG. 16 is a diagram illustrating schematically an exemplary configuration when the optical communication device according to the first and second embodiments is applied to optical communication between information processing apparatus.

In FIG. 16, as an example of the present application example, the configuration according to the first embodiment illustrated in FIG. 1 is applied to optical communication between information processing apparatus is illustrated. Referring to FIG. 16, a transmission and reception system for transmitting various data by using optical communication includes a transmission apparatus 1010 and a reception apparatus 1020. The transmission apparatus 1010 and the reception apparatus 1020 are examples of the information processing apparatus, and may be various types of information processing apparatus such as PC, WS, and a server. The transmission apparatus 1010 and the reception apparatus 1020 include the optical communication devices 10 and 20, for example, according to the first embodiment having the configuration shown in FIGS. 1 and 2, and can transmit various data through the optical communication devices 10 and 20 by using optical communication. In FIG. 16, components other than those shown in FIG. 1 including the processor 310 and the optical communication devices 10 and 20 among the components of the transmission apparatus 1010 and the reception apparatus 1020 are omitted. The transmission apparatus 1010 and the reception apparatus 1020 may include various components included in a general known information processing apparatus as a structure that is not shown. A structure that is not shown may be a known structure used in a general information processing apparatus, so a detailed description thereof will be omitted.

In the example shown in FIG. 16, the transmitting-side optical communication device 10 of the transmission apparatus 1010 and the receiving-side optical communication device 20 of the reception apparatus 1020 are connected to each other by a light guide member 320. The light guide member 320 may be an optical fiber, and connects the transmission apparatus 1010 with the reception apparatus 20 via a communication network (not shown).

The information subjected to various processing by the processor 310 included in the transmission apparatus 1010 is converted from an electrical signal into a light signal through photoelectric conversion by the optical communication device 10, and then the light on which the converted predetermined information is superimposed is transmitted to the reception apparatus 1020 through the light guide member 320. The reception apparatus 1020 receives the light propagated through the light guide member 320 from the optical communication device 20, and the light is subjected to photoelectric conversion and is converted into an electrical signal on which predetermined information is superimposed, and then the converted electrical signal is inputted to the processor 310 included in the reception apparatus 1020. In this way, optical communication between the transmission apparatus 1010 and the reception apparatus 1020 through the optical communication devices 10 and 20 according to the first embodiment is established.

In the example shown in FIG. 16, the case where the transmitting-side optical communication device 10 of the transmission apparatus 1010 and the receiving-side optical communication device 20 of the reception apparatus 1020 are connected to each other by the light guide member 320 and data is transmitted from the transmission apparatus 1010 to the reception apparatus 1020 has been described, but the present application example is not limited to this example. The transmission and reception system 1000 may have a configuration in which a receiving-side optical communication device 20 of the transmission apparatus 1010 and a transmitting-side optical communication device 10 of the reception apparatus 1020 are connected to each other by the light guide member 320 and then the transmission apparatus 1010 and the reception apparatus 1020 can exchange various information to each other by using optical communication.

In the above, there has been described the data transmission between two types of information processing apparatus of the transmission apparatus 1010 and the reception apparatus 1020, but the present application example is not limited to this example. The transmission and reception system 1000 may have a configuration in which three or more information processing apparatus are connected to one another through the light guide member 320 via the optical communication devices 10 and 20 and then they can transmit and receive various information to one another by using optical communication.

Moreover, in the above, as an example of the present application example, the configuration in which the optical communication devices 10 and 20 according to the first embodiment shown in FIGS. 1 and 2 are applied to optical communication between information processing apparatus has been described, but the present application example is not limited to this example. The embodiments and modifications described above are also similarly applicable to optical communication between information processing apparatus.

4. Supplement

The preferred embodiments of the present disclosure have been described above in detail with reference to the accompanying drawings, but the technical scope of the present disclosure is not limited to the above examples. A person skilled in the art may find various alterations and modifications within the scope of the appended claims, and it should be understood that they will naturally come under the technical scope of the present disclosure.

In addition, the technical advantages mentioned herein are to be considered illustrative or exemplary and non-restrictive. The technology according to the embodiments of the present disclosure can provide other advantages apparent to those skilled in the art from the description given herein, in addition to or as an alternative to the above advantages.

Additionally, the present technology may also be configured as below.

(1) An optical communication device including:
  a first substrate configured to include an optical device disposed on a first surface of the first substrate, the optical device including at least one of a light receiving element and a light emitting element; and
  a drive circuit provided in a region corresponding to a position at which the optical device is disposed in a second surface located on an opposite side of the first surface of the first substrate and configured to drive the optical device,
  wherein the drive circuit and the optical device are electrically connected to each other through a through via formed through the first substrate, and
  wherein the optical communication device further includes a signal processing substrate stacked over the second surface of the first substrate in a manner that the signal processing substrate having a signal processing circuit formed on the signal processing substrate covers at least a region corresponding to a position at which the optical device is disposed, the signal processing circuit being configured to perform a predetermined process on an electrical signal exchanged between the drive circuit and the signal processing circuit.

(2) The optical communication device according to (1), further including:
  an interposer substrate stacked over the first substrate to face the drive circuit,
  wherein the signal processing substrate is stacked over the interposer substrate in a manner that the signal processing circuit faces the interposer substrate, and
  wherein the signal processing circuit and the drive circuit are electrically connected to each other by a through via formed through the interposer substrate.

(3) The optical communication device according to (2), further including:
  a first lens substrate provided over the first surface of the first substrate to cover the optical device, the first lens substrate including a first lens formed at a position facing the optical device; and
  an optical input/output unit configured to include a second lens substrate having a second lens formed at a position facing the first lens on the first lens substrate and configured to allow light to be incident on the optical device and to be emitted from the optical device through the first and second lenses, the second lens substrate being provided to face the optical device in a manner that the first lens substrate is positioned between the second lens substrate and the optical device,
  wherein the first substrate and the second lens substrate are aligned in a plane based on a first alignment pattern provided in a surface of the interposer substrate, and
  wherein the first lens substrate is aligned in a plane based on a second alignment pattern provided in the drive circuit over the first substrate.

(4) The optical communication device according to (3), wherein the interposer substrate and the second lens substrate are connected to each other through a positioning pin,
  wherein the positioning pin has one end aligned in a self-aligned manner by a solder connection with respect to the first alignment pattern and connected to the interposer substrate, and
  wherein the positioning pin has the other end fitted to a fitting part formed on the second lens substrate, the fitting part being formed to be aligned with respect to the first alignment pattern.

(5) The optical communication device according to (3) or (4), wherein the first lens substrate is electrically connected to the drive circuit through the through via,
  wherein the optical device is disposed on a surface located on an opposite side of a surface on which the first lens is formed in the first lens substrate and is electrically connected to the drive circuit through the first lens substrate,
  wherein the first substrate is aligned in a self-aligned manner by a solder connection with respect to a pad formed on the interposer substrate together with the first alignment pattern and is connected to the interposer substrate,
  wherein the first lens substrate is aligned in a self-aligned manner by a solder connection with respect to the through via formed in the first substrate together with the second alignment pattern and is connected to the first substrate, and
  wherein the optical device is aligned in a self-aligned manner by a solder connection with respect to the first lens substrate and is connected to the first lens substrate.

(6) The optical communication device according to (1), wherein the first substrate is an interposer substrate,
  wherein the drive circuit is formed over the signal processing substrate together with the signal processing circuit,
  wherein the signal processing substrate is stacked over the interposer substrate in a manner that the drive circuit and the signal processing circuit face the interposer substrate, and
  wherein the signal processing circuit and the drive circuit are electrically connected to each other by a through via formed through the interposer substrate.

(7) The optical communication device according to (6), further including:
  a first lens substrate provided over the first surface of the interposer substrate to cover the optical device, the first lens substrate including a first lens formed at a position facing the optical device; and
  an optical input/output unit configured to include a second lens substrate having a second lens formed at a position facing the first lens on the first lens substrate and configured to allow light to be incident on the optical device and to be emitted from the optical device through the first and second lenses, the second lens substrate being provided to face the optical device in a manner that the first lens substrate is positioned between the second lens substrate and the optical device, wherein the first lens substrate and the second lens substrate are aligned in a plane based on a first alignment pattern provided in a surface of the interposer substrate.

(8) The optical communication device according to (7), wherein the interposer substrate and the second lens substrate are connected to each other through a positioning pin, wherein the positioning pin has one end aligned in a self-aligned manner by a solder connection with respect to the first alignment pattern and connected to the interposer substrate, and wherein the positioning pin has the other end fitted to a fitting part formed on the second lens substrate, the fitting part being formed to be aligned with respect to the first alignment pattern.

(9) The optical communication device according to (7) or (8), wherein the first lens substrate is electrically connected to the drive circuit through the through via, wherein the optical device is disposed on a surface located on an opposite side of a surface on which the first lens is formed in the first lens substrate and is electrically connected to the drive circuit through the first lens substrate, wherein the first lens substrate is aligned in a self-aligned manner by a solder connection with respect to a pad formed on the interposer substrate together with the first alignment pattern and is connected to the interposer substrate, and wherein the optical device is aligned in a self-aligned manner by a solder connection with respect to the first lens substrate and is connected to the first lens substrate.

(10) The optical communication device according to any one of (2) to (9), further including a thin film capacitor formed in the interposer substrate and configured to be electrically connected between a power supply line and a ground line of the drive circuit and between a power supply line and a ground line of the optical device.

(11) The optical communication device according to (10), wherein the power supply line and the ground line of the drive circuit are electrically connected to a power supply line and a ground line of the interposer substrate, respectively, and the power supply line and the ground line of the optical device are electrically connected to the power supply line and the ground line of the interposer substrate, respectively.

(12) The optical communication device according to (10) or (11), wherein the thin film capacitor is electrically connected between a power supply line and a ground line of the signal processing circuit, and wherein the power supply line and the ground line of the signal processing circuit are electrically connected to the power supply line and the ground line of the interposer substrate, respectively.

(13) The optical communication device according to any one of (10) to (12), wherein a resistor is connected between the thin film capacitor and the power supply line of the optical device and between the thin film capacitor and the ground line of the optical device, the resistor having a predetermined value.

(14) A transmission apparatus including:
an optical communication device including
a first substrate having a light emitting element disposed over a first surface of the first substrate, and
a drive circuit provided in a region corresponding to a position at which the light emitting element is disposed over a second surface located on an opposite side of the first surface of the first substrate and configured to drive the light emitting element, wherein the drive circuit and the light emitting element are electrically connected to each other in the optical communication device through a through via formed through the first substrate, wherein the transmission apparatus further includes a signal processing substrate stacked over the second surface of the first substrate in a manner that the signal processing substrate having a signal processing circuit formed on the signal processing substrate covers at least a region corresponding to a position at which the light emitting element is disposed, the signal processing circuit being configured to perform a predetermined process on an electrical signal exchanged between the drive circuit and the signal processing circuit, and wherein the transmission apparatus transmits light to any apparatus through the optical communication device, the light having predetermined information superimposed on the light.

(15) A reception apparatus including:
an optical communication device including
a first substrate having a light receiving element disposed over a first surface of the first substrate, and
a drive circuit provided in a region corresponding to a position at which the light receiving element is disposed over a second surface located on an opposite side of the first surface of the first substrate and configured to drive the light receiving element, wherein the drive circuit and the light receiving element are electrically connected to each other in the optical communication device through a through via formed through the first substrate, wherein the reception apparatus further includes a signal processing substrate stacked over the second surface of the first substrate in a manner that the signal processing substrate having a signal processing circuit formed on the signal processing substrate covers at least a region corresponding to a position at which the light receiving element is disposed, the signal processing circuit being configured to perform a predetermined process on an electrical signal exchanged between the drive circuit and the signal processing circuit, and wherein the reception apparatus receives light transmitted from any apparatus through the optical communication device, the light having predetermined information superimposed on the light.

(16) A transmission and reception system including:
a transmission apparatus configured to include an optical communication device and configured to transmit light having predetermined information superimposed on the light to any apparatus through the optical communication device, the optical communication device including
a first substrate configured to include an optical device disposed over a first surface of the first substrate, the optical device including at least one of a light receiving element and a light emitting element, and
a drive circuit provided in a region corresponding to a position at which the optical device is disposed over a second surface located on an opposite side of the first surface of the first substrate and configured to drive the optical device; and
a reception apparatus configured to include the optical communication device and to receive the light transmitted from the transmission apparatus through the optical communication device, wherein the drive circuit and the optical device are electrically connected to each other in the optical communication device through a through via formed through the first substrate, and wherein the transmission and reception system further includes a signal processing substrate stacked over the second surface of the first substrate in the transmission apparatus and the reception apparatus in a manner that the signal processing substrate having a signal processing circuit formed on the signal processing substrate covers at least a region corresponding to a position at which the optical device is disposed, the signal processing circuit performing a predetermined process on an electrical signal exchanged between the drive circuit and the signal processing circuit.

(17) An optical communication device including:

a first substrate configured to include an optical device disposed on a first surface of the first substrate, the optical device including at least one of a light receiving element and a light emitting element; and a drive circuit provided in a region corresponding to a position at which the optical device is disposed in a second surface located on an opposite side of the first surface of the first substrate and configured to drive the optical device, wherein the drive circuit and the optical device are electrically connected to each other through a through via formed through the first substrate, and wherein the optical communication device further includes a thin film capacitor formed in the first substrate or inside another substrate staked over the first substrate, the thin film capacitor being electrically connected between a power supply line and a ground line of the drive circuit and between a power supply line and a ground line of the optical device.

(18) The optical communication device according to (17), further including:

an interposer substrate stacked over the first substrate to face the drive circuit; and a signal processing substrate including a signal processing circuit configured to perform a predetermined process on an electrical signal exchanged between the drive circuit and the signal processing circuit, the signal processing substrate being stacked over the interposer substrate in a manner that the signal processing circuit faces the interposer substrate, wherein the signal processing circuit and the drive circuit are electrically connected to each other by a through via formed through the interposer substrate, wherein the power supply line and the ground line of the drive circuit are electrically connected to a power supply line and a ground line of the interposer substrate, respectively, and wherein the power supply line and the ground line of the optical device are electrically connected to the power supply line and the ground line of the interposer substrate, respectively.

(19) The optical communication device according to (17), wherein the first substrate is an interposer substrate, wherein the optical communication device further includes a signal processing substrate including a signal processing circuit configured to perform a predetermined process on an electrical signal exchanged between the drive circuit and the signal processing circuit, the signal processing substrate being stacked over the second surface of the interposer substrate in a manner that the signal processing circuit faces the interposer substrate, wherein the drive circuit is formed over the signal processing substrate together with the signal processing circuit, wherein the power supply line and the ground line of the drive circuit are electrically connected to a power supply line and a ground line of the interposer substrate, respectively, and wherein the power supply line and the ground line of the optical device are electrically connected to the power supply line and the ground line of the interposer substrate, respectively.

(20) The optical communication device according to (18) or (19), wherein the thin film capacitor is electrically connected between a power supply line and a ground line of the signal processing circuit, and wherein the power supply line and the ground line of the signal processing circuit are electrically connected to the power supply line and the ground line of the interposer substrate, respectively.

(21) The optical communication device according to any one of (18) to (20), wherein a resistor is connected between the thin film capacitor and the power supply line of the optical device and between the thin film capacitor and the ground line of the optical device, the resistor having a predetermined value.

(22) The optical communication device according to (18), further including:

a first lens substrate provided over the first surface of the first substrate to cover the optical device, the first lens substrate including a first lens formed at a position facing the optical device; and an optical input/output unit configured to include a second lens substrate having a second lens formed at a position facing the first lens on the first lens substrate and configured to allow light to be incident on the optical device and to be emitted from the optical device through the first and second lenses, the second lens substrate being provided to face the optical device in a manner that the first lens substrate is positioned between the second lens substrate and the optical device, wherein the first substrate and the second lens substrate are aligned in a plane based on a first alignment pattern provided in a surface of the interposer substrate, and wherein the first lens substrate is aligned in a plane based on a second alignment pattern provided in the drive circuit over the first substrate.

(23) The optical communication device according to (22), wherein the interposer substrate and the second lens substrate are connected to each other through a positioning pin, wherein the positioning pin has one end aligned in a self-aligned manner by a solder connection with respect to the first alignment pattern and connected to the interposer substrate, and wherein the positioning pin has the other end fitted to a fitting part formed on the second lens substrate, the fitting part being formed to be aligned with respect to the first alignment pattern.

(24) The optical communication device according to (22) or (23), wherein the first lens substrate is electrically connected to the drive circuit through the through via, wherein the optical device is disposed on a surface located on an opposite side of a surface on which the first lens is formed in the first lens substrate and is electrically connected to the drive circuit through the first lens substrate, wherein the first substrate is aligned in a self-aligned manner by a solder connection with respect to a pad formed on the interposer substrate together with the first alignment pattern and is connected to the interposer substrate, wherein the first lens substrate is aligned in a self-aligned manner by a solder connection with respect to the through via formed in the first substrate together with the second alignment pattern and is connected to the first substrate, and wherein the optical device is aligned in a self-aligned manner by a solder connection with respect to the first lens substrate and is connected to the first lens substrate.

(25) The optical communication device according to (19), further including:

a first lens substrate provided over the first surface of the interposer substrate to cover the optical device, the first lens substrate including a first lens formed at a position facing the optical device; and an optical input/output unit configured to include a second lens substrate having a second lens formed at a position facing the first lens on the first lens substrate and configured to allow light to be incident on the optical device and to be emitted from the optical device through the first and second lenses, the second lens substrate being provided to face the optical device in a manner that the first lens substrate is positioned between the second lens substrate and the optical device, wherein the first lens substrate and the second lens substrate are aligned in a plane based on a first alignment pattern provided in a surface of the interposer substrate.

(26) The optical communication device according to (25), wherein the interposer substrate and the second lens substrate are connected to each other through a positioning pin, wherein the positioning pin has one end aligned in a self-aligned manner by a solder connection with respect to the first alignment pattern and connected to the interposer substrate, and wherein the positioning pin has the other end fitted to a fitting part formed on the second lens substrate, the fitting part being formed to be aligned with respect to the first alignment pattern.

(27) The optical communication device according to (25) or (26), wherein the first lens substrate is electrically connected to the drive circuit through the through via, wherein the optical device is disposed on a surface located on an opposite side of a surface on which the first lens is formed in the first lens substrate and is electrically connected to the drive circuit through the first lens substrate, wherein the first lens substrate is aligned in a self-aligned manner by a solder connection with respect to a pad formed on the interposer substrate together with the first alignment pattern and is connected to the interposer substrate, and wherein the optical device is aligned in a self-aligned manner by a solder connection with respect to the first lens substrate and is connected to the first lens substrate.

(28) A transmission apparatus including:
an optical communication device including a first substrate having a light emitting element disposed over a first surface of the first substrate, and a drive circuit provided in a region corresponding to a position at which the light emitting element is disposed over a second surface located on an opposite side of the first surface of the first substrate, and configured to drive the light emitting element, wherein the drive circuit and the light emitting element are electrically connected to each other through a through via formed through the first substrate in the optical communication device, wherein the transmission apparatus further includes a thin film capacitor formed in the first substrate or inside another substrate staked over the first substrate, the thin film capacitor being electrically connected between a power supply line and a ground line of the drive circuit and between a power supply line and a ground line of the light emitting element, and wherein the transmission apparatus transmits light to any apparatus through the optical communication device, the light having predetermined information superimposed on the light.

(29) A reception apparatus including:
an optical communication device including a first substrate having a light receiving element disposed over a first surface of the first substrate, and a drive circuit provided in a region corresponding to a position at which the light receiving element is disposed over a second surface located on an opposite side of the first surface of the first substrate, and configured to drive the light receiving element, wherein the drive circuit and the light receiving element are electrically connected to each other through a through via formed through the first substrate in the optical communication device, wherein the reception apparatus further includes a thin film capacitor formed in the first substrate or inside another substrate staked over the first substrate, the thin film capacitor being electrically connected between a power supply line and a ground line of the drive circuit and between a power supply line and a ground line of the light receiving element, and wherein the reception apparatus receives light transmitted from any apparatus through the optical communication device, the light having predetermined information superimposed on the light.

(30) A transmission and reception system including:

a transmission apparatus configured to include an optical communication device and configured to transmit light having predetermined information superimposed on the light to any apparatus through the optical communication device, the optical communication device including a first substrate configured to include an optical device disposed over a first surface of the first substrate, the optical device including at least one of a light receiving element and a light emitting element, and a drive circuit provided in a region corresponding to a position at which the optical device is disposed over a second surface located on an opposite side of the first surface of the first substrate and configured to drive the optical device; and a reception apparatus configured to include the optical communication device and to receive the light transmitted from the transmission apparatus through the optical communication device, wherein the drive circuit and the optical device are electrically connected to each other through a through via formed through the first substrate in the optical communication device, and wherein the transmission and reception system further includes a thin film capacitor formed in the first substrate or inside another substrate staked over the first substrate in the transmission apparatus and the reception apparatus, the thin film capacitor being electrically connected between a power supply line and a ground line of the drive circuit and between a power supply line and a ground line of the optical device.

(A001) An optical communication device comprising: a drive circuit substrate having a first surface side and a second surface side opposite to the first surface side; and a first through via extending through the drive circuit substrate, the first through via being configured to electrically connect an optical element disposed on the first surface side of the drive circuit substrate to a drive circuit disposed on the second surface side of the drive circuit substrate.

(A002) The optical communication device according to (A001), further comprising: a first lens attached to a lens substrate, the first lens facing a second lens that is disposed on the first surface side of the drive circuit substrate; and a positioning element attached to an interposer substrate, the positioning element being configured to align optical axes of the first and second lenses.

(A003) The optical communication device according to (A001), wherein the positioning element includes a fitting part that interfaces with a receptacle portion of the lens substrate to align the optical axes of the first and second lenses.

(A004) The optical communication device according to (A001), further comprising: an interposer substrate, positioned above the second surface side of the drive circuit substrate; and a second through via extending through the interposer substrate, the second through via being configured to electrically connect the drive circuit to a signal processing circuit disposed on a signal processing substrate positioned above the interposer substrate.

(A005) The optical communication device according to (A004), wherein the signal processing substrate is vertically stacked above the interposer substrate, such that a wiring length to connect the signal processing circuit to the drive circuit through the second through via is substantially equal to a vertical thickness of the interposer substrate.

(A006) The optical communication device according to (A001), further comprising: a bypass capacitor formed in the interposer substrate and connected to the drive circuit.

(A007) The optical communication device according to (A004), further comprising: a bypass capacitor formed in the interposer substrate and connected to the signal processing circuit.

(A008) The optical communication device according to (A006), wherein the bypass capacitor comprises a first thin film and a second thin film formed in the interposer substrate, the first thin film being connected to a non-ground potential and the second thin film being connected to a ground potential.

(A009) The optical communication device according to (A002), wherein the drive circuit substrate is disposed between the interposer substrate and the lens substrate, and the first through via extends along a vertical axis that intersects respective positions of the drive circuit and the optical element.

(A010) The optical communication device according to (A001), wherein the optical element is a light receiving element.

(A011) The optical communication device according to (A001), wherein the optical element is a light transmitting element.

(A012) An optical communication device comprising: a signal processing substrate having a signal processing circuit and a drive circuit attached thereto, the signal processing circuit being electrically connected to the drive circuit on the signal processing substrate; an interposer substrate having a first surface side and a second surface side opposite to the first surface side; and a through via extending through the interposer substrate, the through via being configured to electrically connect an optical element disposed on the first surface side of the interposer substrate to the drive circuit in a region where the drive circuit is located on the signal processing substrate.

(A013) The optical communication device according to claim (A012), wherein the region corresponds to a position where the optical element is disposed.

(A014) The optical communication device according to (A012), wherein: the signal processing substrate includes another drive circuit that is electrically connected to the signal processing circuit on the signal processing substrate; and another through via extends through the interposer substrate and is configured to electrically connect a light transmitting element disposed on the first surface side of the interposer substrate to the other drive circuit in a region where the other drive circuit is located on the signal processing substrate.

(A015) A reception system comprising: a signal processing circuit; a drive circuit substrate having a first surface side and a second surface side opposite to the first surface side; and a first through via extending through the drive circuit substrate, the first through via being configured to electrically connect a light receiving element disposed on the first surface side of the drive circuit substrate to a drive circuit disposed on the second surface side of the drive circuit substrate.

(A016) The reception system according to (A015), further comprising:
a first lens attached to a lens substrate, the first lens facing a second lens that is disposed on the first surface side of the drive circuit substrate;
a positioning element attached to an interposer substrate, the positioning element being configured to align optical axes of the first and second lenses.

(A017) The reception system according to (A016), wherein the positioning element includes a fitting part that interfaces with a receptacle portion of the lens substrate to align the optical axes of the first and second lenses.

(A018) The reception system according to (A015), further comprising: an interposer substrate, positioned above the second surface side of the drive circuit substrate; and a second through via extending through the interposer substrate, the second through via being configured to electrically connect the drive circuit to the signal processing circuit, the signal processing circuit being disposed on a signal processing substrate positioned above the interposer substrate.

(A019) The reception system according to (A018), wherein the signal processing substrate is vertically stacked above the interposer substrate, such that a wiring length to connect the signal processing circuit to the drive circuit through the second through via is substantially equal to a vertical thickness of the interposer substrate.

(A020) A transmission system comprising: a signal processing circuit; a drive circuit substrate having a first surface side and a second surface side opposite to the first surface side; and a first through via extending through the drive circuit substrate, the first through via being configured to electrically connect a light transmitting element disposed on the first surface side of the drive circuit substrate to a drive circuit disposed on the second surface side of the drive circuit substrate.

What is claimed is:

1. An optical communication device comprising:
   a drive circuit substrate having a first surface side and a second surface side opposite to the first surface side; and
   a first through via extending through the drive circuit substrate, the first through via being configured to electrically connect an optical element disposed on the first surface side of the drive circuit substrate to a drive circuit disposed on and in contact with the second surface side of the drive circuit substrate.

2. The optical communication device according to claim 1, further comprising:
   a first lens attached to a lens substrate, the first lens facing a second lens that is disposed on the first surface side of the drive circuit substrate;
   a positioning element attached to an interposer substrate, the positioning element being configured to align optical axes of the first and second lenses.

3. The optical communication device according to claim 2, wherein the positioning element includes a fitting part that interfaces with a receptacle portion of the lens substrate to align the optical axes of the first and second lenses.

4. The optical communication device according to claim 1, further comprising:
   an interposer substrate, positioned above the second surface side of the drive circuit substrate; and
   a second through via extending through the interposer substrate, the second through via being configured to electrically connect the drive circuit to a signal processing circuit disposed on a signal processing substrate positioned above the interposer substrate.

5. The optical communication device according to claim 4, wherein the signal processing substrate is vertically stacked above the interposer substrate, such that a wiring length to connect the signal processing circuit to the drive circuit through the second through via is substantially equal to a vertical thickness of the interposer substrate.

6. The optical communication device according to claim 4, further comprising:
   a bypass capacitor formed in the interposer substrate and connected to the drive circuit.

7. The optical communication device according to claim 4, further comprising:
   a bypass capacitor formed in the interposer substrate and connected to the signal processing circuit.

8. The optical communication device according to claim 6, wherein the bypass capacitor comprises a first thin film and a second thin film formed in the interposer substrate, the first thin film being connected to a non-ground potential and the second thin film being connected to a ground potential.

9. The optical communication device according to claim 4, wherein the drive circuit substrate is disposed between the interposer substrate and the lens substrate, and the first through via extends along a vertical axis that intersects respective positions of the drive circuit and the optical element.

10. The optical communication device according to claim 1, wherein the optical element is a light receiving element.

11. The optical communication device according to claim 1, wherein the optical element is a light transmitting element.

12. The optical communication device according to claim 1, further comprising:
    a lens substrate disposed the first surface side of the drive circuit substrate; and
    a solder bump disposed between the lens substrate and the drive circuit substrate, the solder bump configured to electrically connect the optical element to the first through via.

13. The optical communication device according to claim 12, wherein the lens substrate is vertically stacked below the drive circuit substrate, such that a wiring length to connect the solder bump to the drive circuit through the first through via is substantially equal to a vertical thickness of the drive circuit substrate.

14. The optical communication device according to claim 1, wherein the optical element is mounted to the first surface side of the drive substrate so as to be directly electrically connected to the first through via.

15. The optical communication device according to claim 14, wherein the optical element is vertically stacked below of the drive substrate, such that a wiring length to connect the optical element to the drive circuit through the first through via is substantially equal to a vertical thickness of the drive circuit substrate.

* * * * *